(12) United States Patent
Ueta

(10) Patent No.: US 12,342,674 B2
(45) Date of Patent: Jun. 24, 2025

(54) LIGHT-EMITTING ELEMENT AND DISPLAY DEVICE

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 534 days.

(21) Appl. No.: 17/772,720

(22) PCT Filed: Nov. 14, 2019

(86) PCT No.: PCT/JP2019/044652
§ 371 (c)(1),
(2) Date: Apr. 28, 2022

(87) PCT Pub. No.: WO2021/095194
PCT Pub. Date: May 20, 2021

(65) Prior Publication Data
US 2023/0031652 A1 Feb. 2, 2023

(51) Int. Cl.
| | |
|---|---|
| H10K 50/813 | (2023.01) |
| H10K 50/15 | (2023.01) |
| H10K 59/12 | (2023.01) |
| H10K 59/35 | (2023.01) |
| H10K 59/80 | (2023.01) |
| H10K 50/818 | (2023.01) |

(52) U.S. Cl.
CPC .......... *H10K 50/813* (2023.02); *H10K 50/15* (2023.02); *H10K 59/80515* (2023.02); *H10K 50/818* (2023.02); *H10K 59/12* (2023.02); *H10K 59/35* (2023.02); *H10K 59/80518* (2023.02)

(58) Field of Classification Search
CPC .......... H10K 50/813; H10K 59/80515; H10K 50/15; H10K 50/14; H10K 71/621
See application file for complete search history.

(56) References Cited

U.S. PATENT DOCUMENTS

| | | | |
|---|---|---|---|
| 6,704,335 B1 * | 3/2004 | Koyama | H01S 3/0635 313/503 |
| 9,029,838 B2 * | 5/2015 | Lim | H10K 50/813 257/40 |
| 10,229,955 B2 * | 3/2019 | Kikuchi | H10K 59/38 |
| 2002/0018620 A1 * | 2/2002 | Koyama | H10K 50/858 257/E33.068 |
| 2004/0222740 A1 | 11/2004 | Kim | |
| 2007/0120136 A1 | 5/2007 | Noda et al. | |
| 2008/0116791 A1 | 5/2008 | Kim | |

(Continued)

FOREIGN PATENT DOCUMENTS

| | | |
|---|---|---|
| JP | 2000-200687 A | 7/2000 |
| JP | 2004-311419 A | 11/2004 |

(Continued)

*Primary Examiner* — Chad M Dicke
*Assistant Examiner* — Jeremy Daniel Watts
(74) *Attorney, Agent, or Firm* — ScienBiziP, P.C.

(57) ABSTRACT

A light-emitting element includes an anode, an HTL, an EML, an ETL, and a cathode layered in this order, the HTL includes at least one protruding portion protruding in a layering direction, and an IL overlapping the protruding portion in a plan view is provided between the protruding portion and the EML.

18 Claims, 27 Drawing Sheets

(56) References Cited

U.S. PATENT DOCUMENTS

| | | | |
|---|---|---|---|
| 2016/0248038 A1* | 8/2016 | Philippens | H10K 59/80518 |
| 2017/0250362 A1 | 8/2017 | Hiraga | |
| 2018/0190932 A1* | 7/2018 | Koo | H10K 59/878 |
| 2019/0067642 A1* | 2/2019 | Kim | H10K 59/38 |

FOREIGN PATENT DOCUMENTS

| | | |
|---|---|---|
| JP | 2004-335470 A | 11/2004 |
| JP | 2013-157180 A | 8/2013 |
| JP | 2013-207118 A | 10/2013 |
| JP | 2017-157314 A | 9/2017 |

* cited by examiner

LIGHT-EMITTING ELEMENT AND DISPLAY DEVICE

TECHNICAL FIELD

The disclosure relates to a light-emitting element and a display device including the light-emitting element.

BACKGROUND ART

In recent years, various display devices including self-luminous light-emitting elements have been developed. Examples of such a display device include a display device provided with an organic light-emitting diode (OLED), and a display device provided with an inorganic light-emitting diode or a quantum dot light-emitting diode (QLED).

For example, PTL 1 discloses, as a light-emitting device applicable to a display device, a light-emitting device including a self-luminous light-emitting element in which an anode, a hole transport layer, a light-emitting layer composed of a quantum dot film, an electron transport layer, and a cathode are layered in this order from a substrate side.

CITATION LIST

Patent Literature

PTL 1: JP 2013-157180 A
PTL 2: JP 2013-207118 A

SUMMARY OF INVENTION

Technical Problem

Nevertheless, in a self-luminous light-emitting element used in a display device as described above, for electrons, a high barrier exists between the electron transport layer and the light-emitting layer. For holes, a high barrier exists between the anode and the hole transport layer.

The electron transport layer and the hole transport layer, which are carrier transport layers, transport carriers, but are also paths of light extraction. Therefore, in addition to electrical characteristics, these carrier transport layers require light transmission properties. This makes it difficult to increase the carrier density in the electron transport layer and in the hole transport layer.

SUMMARY

Thus, the self-luminous light-emitting element in the related art described above is problematic in that an injection efficiency of the holes and the electrons, which are carriers, is low regardless of whether the material constituting the light-emitting element is an organic material or an inorganic material.

An external quantum efficiency (EQE) of the light-emitting element indicates a ratio of the number of photons extracted to outside the light-emitting element to the number of carriers injected into the light-emitting element. EQE is expressed as EQE=Carrier injection efficiency×Carrier balance×Light extraction efficiency×Internal quantum efficiency (IQE). Accordingly, when the carrier injection efficiency is low, the EQE becomes low.

As illustrated in PTL 1, in a typical light-emitting element in the related art, the surface of each layer has a flat shape in a cross-sectional view. Therefore, an electric field from the surface of the carrier transport layer toward the light-emitting layer is only in a direction parallel to the layer thickness direction of the light-emitting layer, and carriers are injected only in the direction parallel to the layer thickness direction of the light-emitting layer. Therefore, the carrier injection efficiency is low.

Note that PTL 2 discloses improving light extraction efficiency in an OLED by forming, at an interface between a hole transport layer and an organic light-emitting layer, a molecular orientation surface having an uneven shape for orienting organic compound molecules of an organic light-emitting material in one direction. However, the technique in PTL 2 improves light extraction by controlling polarization by aligning, in recessed portions, the organic compound molecules in the organic light-emitting layer with the polarities of dipoles. The orientation of a light-emitting material in a QLED is meaningless. Further, in the configuration of PTL 2, the field intensity of a top wall portion of a protruding portion is high compared to that of other portions, and carrier injection preferentially occurs on the protruding portion. As a result, carrier injection occurs substantially only in the formation region of the protruding portion. Accordingly, the carrier injection efficiency is low.

An aspect of the disclosure has been made in view of the above-described problems, and an object of the disclosure is to provide a light-emitting element and a display device having an external quantum efficiency higher than that in the related art.

Solution to Problem

In order to solve the problems described above, the light-emitting element according to an aspect of the disclosure includes a first electrode, a first carrier transport layer, a light-emitting layer, a second carrier transport layer, and a second electrode, the first electrode, the first carrier transport layer, the light-emitting layer, the second carrier transport layer, and the second electrode being layered in this order. The first carrier transport layer includes at least one first protruding portion protruding in a layering direction, and an insulator layer overlapping the first protruding portion in a plan view is provided between the first protruding portion and the second carrier transport layer.

Further, in order to solve the problems described above, a display device according to an aspect of the disclosure is a display device including a plurality of pixels. The plurality of pixels each include the light-emitting element according to an aspect of the disclosure, the first electrode and the light-emitting layer are formed in an island shape for each of the plurality of pixels, and the second electrode is formed in common with the plurality of pixels.

Advantageous Effects of Disclosure

According to an aspect of the disclosure, it is possible to provide a light-emitting element and a display device having an external quantum efficiency higher than that in the related art.

DESCRIPTION OF EMBODIMENTS

First Embodiment

Hereinafter, an embodiment of the disclosure will be described in detail. In the following, a layer formed in a process before the layer being compared is referred to as a "lower layer," and a layer formed in a process after the layer being compared is referred to as an "upper layer".

Figure 1:
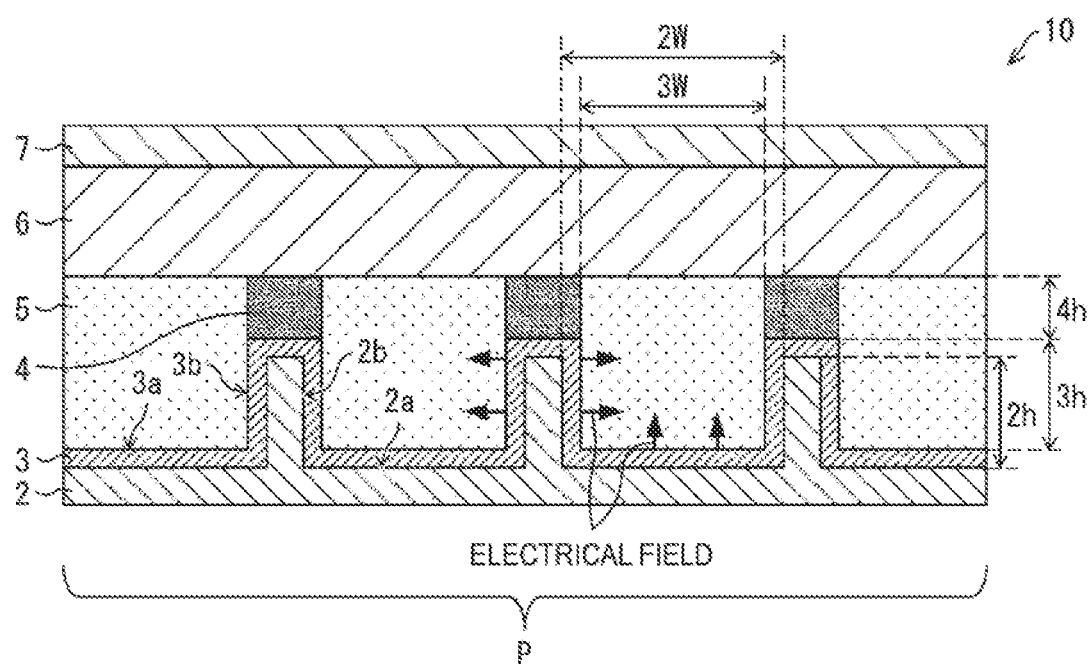
FIG. 1 is a cross-sectional view illustrating an example of a schematic configuration of a light-emitting element according to a first embodiment.
Figure 3:
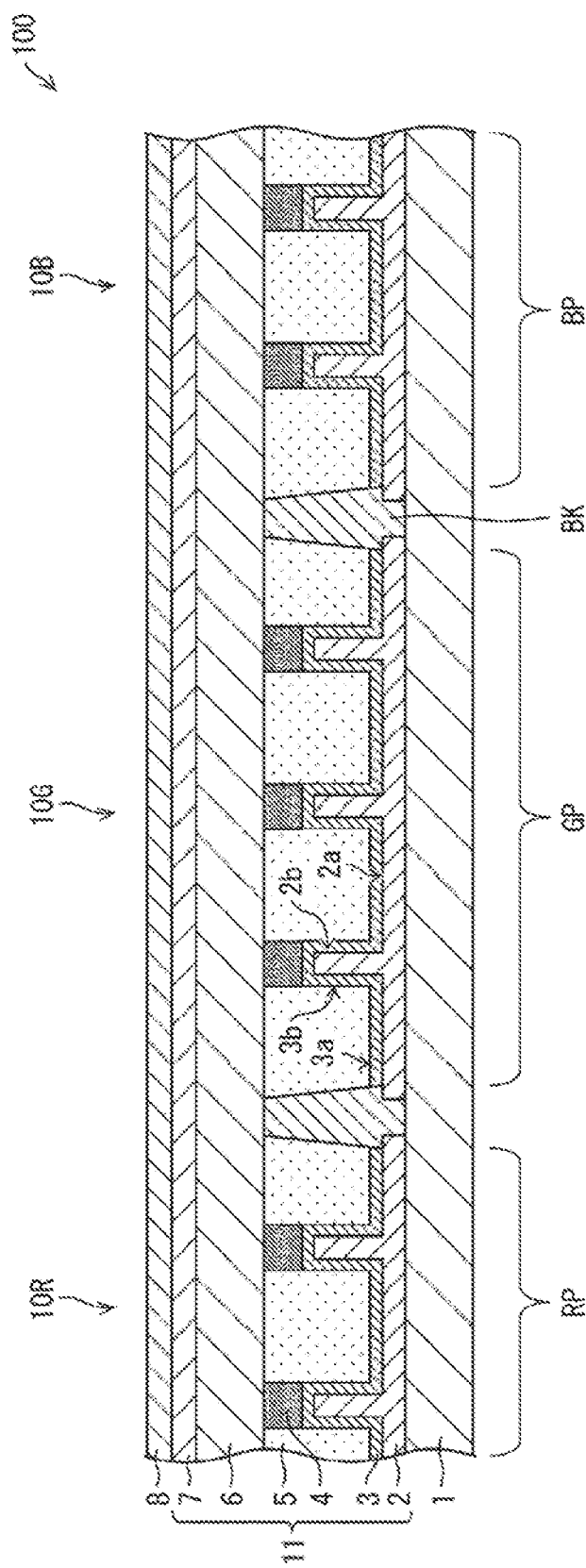
FIG. 3 is a cross-sectional view illustrating a schematic configuration of main portions of a display device according to the first embodiment.

FIG. 1 is a cross-sectional view illustrating an example of a schematic configuration of a light-emitting element 10 according to the present embodiment. FIG. 3 is a cross-sectional view illustrating a schematic configuration of main portions of a display device 100 according to the present embodiment.

The display device 100 illustrated in FIG. 3 includes a light-emitting element 10R, a light-emitting element 10G, and a light-emitting element 10B as the light-emitting elements 10.

Note that the cross section of the light-emitting element 10 illustrated in FIG. 1 corresponds to a cross section of one pixel P of the display device 100. The display device 100 illustrated in FIG. 3 includes a red pixel RP, a green pixel GP, and a blue pixel BP, for example, as the pixels P.

In the red pixel RP, the light-emitting element 10R of red light emission is provided as the light-emitting element 10. In the green pixel GP, the light-emitting element 10G of green light emission is provided as the light-emitting element 10. In the blue pixel BP, the light-emitting element 10B of blue light emission is provided as the light-emitting element 10.

Note that, in the following, in a case in which the pixels RP, GP, BP described above do not particularly need to be distinguished, these pixels RP, GP, BP are collectively and simply referred to as "pixel P". The terms "pixel RP," "pixel GP," or "pixel BP" and "pixel P" are interchangeable. Further, hereinafter, in a case in which the light-emitting elements 10R, 10G, 10B described above do not particularly need to be distinguished, these light-emitting elements 10R, 10G, 10B are collectively and simply referred to as "light-emitting element 10". The terms "light-emitting element 10R," "light-emitting element 10G," or "light-emitting element 10B" and "light-emitting element 10" are interchangeable.

As described above, the display device 100 includes a plurality of the pixels P. The pixels P each include the light-emitting element 10. That is, as illustrated in FIG. 1 and FIG. 3, the light-emitting element 10 is formed for each pixel P in correspondence with the pixel P.

The light-emitting element 10 has a configuration in which a first electrode, a first carrier transport layer, a light-emitting layer, a second carrier transport layer, and a second electrode are layered in this order. Further, the light-emitting element 10 further includes an insulator layer between the first carrier transport layer and the second carrier transport layer. That is, the light-emitting element 10 includes an insulator layer and a light-emitting layer between the first carrier transport layer and the second carrier transport layer.

FIG. 1 and FIG. 3 illustrate a case in which the first electrode is an anode 2, the second electrode is a cathode 7, the first carrier transport layer is a hole transport layer (hereinafter, "HTL") 3, and the second carrier transport layer is an electron transport layer (hereinafter, "ETL") 6 as an example.

Further, as illustrated in FIG. 3, the display device 100 includes a substrate 1, a plurality of the light-emitting elements 10, and a sealing layer 8 covering these light-emitting elements 10. The display device 100 has a configuration in which the layers of the light-emitting elements 10 are layered as a light-emitting element layer 11 including the plurality of light-emitting elements 10 on the substrate 1 serving as a support body.

Therefore, the light-emitting element 10 illustrated in FIG. 1 and FIG. 3 has a configuration in which the anode 2, the HTL 3, a light-emitting layer (hereinafter. "EML") 5, the ETL 6, and the cathode 7 are provided on the substrate 1 in this order from the substrate 1 side, which is a lower layer side. Further, the light-emitting element 10 further includes an insulator layer (hereinafter, "IL") 4 between the HTL 3 and the ETL 6. That is, the light-emitting element 10 includes the IL 4 and the EML 5 between the HTL 3 and the ETL 6.

The light-emitting element 10R includes the EML 5 having a red light emission peak as the EML 5. The light-emitting element 10G includes the EML 5 having a green light emission peak as the EML 5. The light-emitting element 10B includes the EML 5 having a blue light emission peak as the EML 5.

Note that, in the present embodiment, "having a red light emission peak" means "having a light emission peak wavelength in a wavelength band from 600 nm to 780 nm". Further, "having a green light emission peak" means "having a light emission peak wavelength in a wavelength band from 500 nm to 600 nm". "Having a blue light emission peak" means "having a light emission peak wavelength in a wavelength band from 400 nm to 500 nm".

The light-emitting element 10R preferably has a light emission peak wavelength in a wavelength band from 620 nm to 650 nm. Further, the light-emitting element 10G preferably has a light emission peak wavelength in a wavelength band from 520 nm to 540 nm. The light-emitting element 10B preferably has a light emission peak wavelength in a wavelength band from 440 nm to 460 nm.

As illustrated in FIG. 3, the anode 2, the HTL 3, and the EML 5, for example, in the light-emitting element layer 11 are each separated into an island shape for each pixel P by a bank BK. The cathode 7 and the ETL 6 are not separated into an island shape by the bank BK, and are formed in common with each pixel P.

However, in the display device 100, the first electrode, which is the lower electrode, and the first carrier transport layer are formed in an island shape for each pixel P, and the second electrode, which is the upper electrode, is formed in common with each pixel P. Accordingly, the ETL 6, which is the second carrier transport layer, may be separated into an island shape for each pixel P by the bank BK.

The ETL 6, regardless of whether having an island shape or being a common layer as described above, may be formed of a material common to the light-emitting elements 10R, 10G, 10B or may be formed of a different material for each light-emitting element 10R, 10G, 10B. Similarly, the HTL 3 may also be formed of a material common to the light-emitting elements 10R, 10G, 10B or may be formed of a different material for each light-emitting element 10R, 10G, 10B.

The bank BK is formed in a lattice pattern, for example, in a plan view. The bank BK covers a peripheral edge portion of the anode 2. In the bank BK, an opening is provided for each pixel P, and an exposed portion of the anode 2 due to the opening of the bank BK is a light-emitting region of each pixel P. The bank BK functions as an edge cover covering the peripheral edge portion of the anode 2, and functions as a separation wall that separates each pixel P (in other words, separates the light-emitting elements 10).

The bank BK may be formed of a coatable photosensitive organic material, such as a polyimide resin and an acrylic resin, for example.

The sealing layer 8 has light transmission properties and includes, for example, a first inorganic sealing film that covers the cathode 7, an organic sealing film formed on a side above the first inorganic sealing film, and a second inorganic sealing film that covers the organic sealing film. The sealing layer 8 prevents foreign matter such as water or oxygen from infiltrating into the light-emitting elements 10R, 10G, 10B.

Each of the first inorganic sealing film and the second inorganic sealing film may be formed of, for example, a silicon oxide film, a silicon nitride film, or a silicon oxynitride film, or of a layered film of these, formed through the chemical vapor deposition (CVD) method. The organic sealing film is a light-transmitting organic film which is thicker than the first inorganic sealing film and the second inorganic sealing film, and can be formed of a coatable photosensitive organic material such as a polyimide resin or an acrylic resin.

Hereinafter, the substrate 1 and the anode 2, the HTL 3, the IL 4, the EML 5, the ETL 6, and the cathode 7 of the light-emitting element 10 will be described in more detail.

First, a schematic configuration of each layer described above will be described.

The substrate 1 is an array substrate. The substrate 1 is provided with a drive circuit including a plurality of drive elements such as thin film transistors (TFTs; not illustrated) that drive each of the light-emitting elements 10, as a pixel circuit.

The anode 2 injects holes into the EML 5 via the HTL 3. The anode 2 is electrically connected to the TFTs (specifically, for example, drain electrodes of the TFTs) of the substrate 1.

A surface of the anode 2 has unevenness composed of a recessed portion 2a and a protruding portion 2b (second protruding portion) in a cross-sectional view. The anode 2 includes, in a cross section of one pixel P, at least one protruding portion 2b protruding in a layering direction of each layer described above of the light-emitting element 10. In other words, the anode 2 of each light-emitting element 10 includes at least one protruding portion 2b.

FIG. 1 and FIG. 3 illustrate a case in which the anode 2 of each light-emitting element 10 is provided with a plurality of the protruding portions 2b as an example. In this case, it is desirable that the recessed portions 2a and the protruding portions 2b be provided regularly.

The HTL 3 is a layer that transports holes from the anode 2 to the EML 5. The HTL 3 is layered on the anode 2 along the surface of the anode 2. Therefore, in a cross-sectional view, the HTL 3 has unevenness composed of a recessed portion 3a and a protruding portion 3b (first protruding portion) following the shape of the surface of the anode 2. The protruding portion 3b covers a surface of the protruding portion 2b. Further, the recessed portion 3a covers a surface of the recessed portion 2a.

Accordingly, the HTL 3 includes, in a cross section of one pixel P, at least one protruding portion 3b protruding in the layering direction of each layer described above of the light-emitting element 10. In other words, the HTL 3 of each light-emitting element 10 includes at least one protruding portion 3b. Note that FIG. 1 and FIG. 3 illustrate a case in which the HTL 3 of each light-emitting element 10 is provided with a plurality of the protruding portions 3b as an example.

The IL 4 is provided in an island shape in contact with the protruding portion 3b and the ETL 6, between the protruding portion 3b and the ETL 6. The IL 4 is not provided on the recessed portion 3a.

Figure 2:
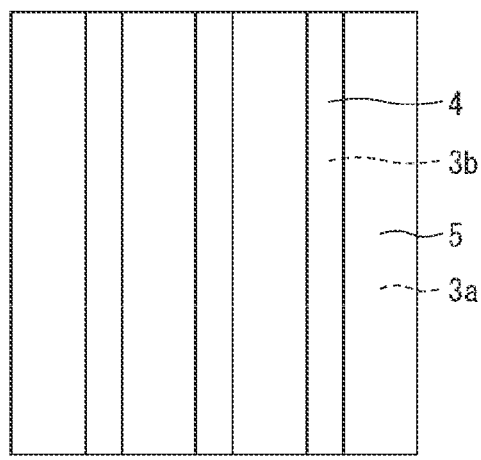
FIG. 2 is a main portion perspective view illustrating an example of a shape of a protruding portion of a hole transport layer and a shape of an insulator layer when the light-emitting element illustrated in FIG. 1 is viewed from above.

FIG. 2 is a main portion perspective view illustrating an example of a shape of the protruding portion 3b and a shape of the IL 4 when the light-emitting element 10 illustrated in 1 is viewed from above. Note that, in FIG. 2, for convenience of illustration, illustration of the ETL 6 and the cathode 7 is omitted.

The IL 4 is formed on the protruding portion 3b in the same shape as that of the protruding portion 3b. As illustrated in FIG. 2, the protruding portion 3b and the IL 4 are each formed in a stripe shape in a plan view, for example.

The EML 5 is a layer that includes a light-emitting material and emits light due to the occurrence of recombination between electrons transported from the cathode 7 and holes transported from the anode 2. As illustrated in FIG. 1, the EML 5 is provided in the recessed portion 3a surrounded by the protruding portion 3b, the IL 4, and the bank BK, and thus the height of an outermost surface of the EML 5 matches (in other words, is flush with) the height of an outermost surface of the IL 4.

The ETL 6 is a layer that transports electrons from the cathode 7 to the EML 5. The ETL 6 is flat, and the ETL 6 is formed in a continuous film shape on the IL 4 and the EML 5, in contact with the IL 4 and the EML 5.

The cathode 7 injects electrons into the EML 5 via the ETL 6. The cathode 7 is also flat, and the cathode 7 is formed in a continuous film shape on the ETL 6.

Next, components (materials) of each layer described above will be described.

The substrate 1 may be constituted of a light-transmissive material or may be constituted of a light-reflective material. However, in a case in which the light-emitting element 10 has a bottom-emitting structure or a double-sided light-emitting structure, a transparent substrate made of a light-transmissive material is used for the substrate 1.

Note that, as described above, the light-emitting element 10 is formed on the substrate 1. Accordingly, the light-emitting element 10 may include the substrate 1 as a support body. In this case, the substrate 1 included in the light-emitting element 10 may be, for example, a glass substrate or a flexible substrate such as a resin substrate.

As the material of the anode 2 and the cathode 7 and the material of the HTL 3 and the ETL 6 of the light-emitting element 10, an organic material or an inorganic material used in a self-light-emitting element for a display panel, for example, can be used.

The anode 2 and the cathode 7 are each composed of a conductive material. Examples of the conductive material described above used for the anode 2 include known metals generally used for anodes, such as aluminum (Al), silver (Ag), and magnesium (Mg), alloys of these metals, inorganic oxides such as indium tin oxide (ITO) and indium gallium zinc oxide (InGaZnOx), and conductive compounds obtained by doping these inorganic oxides with impurities. These conductive materials may be used alone or may be used in combination of two or more as appropriate.

Examples of the conductive material used for the cathode 7 include known metals generally used for cathodes, such as Al, Ag, and Mg, and alloys of these metals. These conductive materials may be used alone or may be used in combination of two or more as appropriate. Further, the alloys described above may further include lithium (Li).

Note that, of the anode 2 and the cathode 7, the electrode on the light extraction surface side needs to be transparent. On the other hand, the electrode on the side opposite to the light extraction surface may or may not be transparent. Accordingly, at least one of the anode 2 and the cathode 7 is made of a light-transmissive material. One of the anode 2 and the cathode 7 may be formed of a light-reflective material. In a case in which the light-emitting element 10 illustrated in FIG. 1 is a top-emitting-type light-emitting element, the cathode 7 being an upper layer is formed of a light-transmissive material, and the anode 2 being a lower layer is formed of a light-reflective material. In a case in which the light-emitting element 10 illustrated in FIG. 1 is a bottom-emitting-type light-emitting element, the cathode 7 being an upper layer is formed of a light-reflective material, and the anode 2 being a lower layer is formed of a light-transmissive material.

The material of the HTL 3 need only be a hole transport material capable of stabilizing the transport of holes into the EML 5, but among such materials, a material having high hole mobility is preferable.

Further, the HTL 3 may have a function of inhibiting the transport of electrons. In this case, the hole transport material is preferably an electron blocking material that prevents the penetration of electrons that have traveled from the cathode 7. This makes it possible to increase a recombination efficiency of the holes and the electrons within the EML 5. Further, the HTL 3 may also have a function as a hole injection layer that promotes the injection of holes from the anode 2 into the EML 5.

A known hole transport material can be used for the HTL 3. The HTL 3 may include, for example, nickel oxide (NiO), copper aluminate (CuAlO$_2$), poly(3,4-ethylenedioxythiophene)-poly(4-styrene sulfonate) (PEDOT:PSS), polyvinylcarbazole (PVK), and poly[(9,9-dioctylfluorenyl-2,7-diyl)-co-(4,4'-(N-4-sec-butylphenyl))diphenylamine)] (TFB), as the hole transport material. These hole transport materials may be used alone or may be used in combination of two or more as appropriate. Further, as the hole transport material described above, nanoparticles may be used.

A known electron transport material can be used for the ETL 6. Note that the ETL 6 may have a function of inhibiting the transport of holes. In this case, the electron transport material is preferably a hole blocking material capable of preventing the penetration of holes that have traveled from the anode 2. This makes it possible to increase a recombination efficiency of the holes and the electrons within the EML 5. Further, the ETL 6 may also have a function as an electron injection layer that promotes the injection of electrons from the cathode 7 into the EML 5.

The ETL 6 may include, for example, a metal oxide, a II-VI compound semiconductor, a III-V compound semiconductor, or a IV-IV compound semiconductor as the electron transport material. Examples of the metal oxide described above include molybdenum trioxide (MoO$_3$), chromium oxide (Cr$_2$O$_3$), nickel oxide (NiO), tungsten trioxide (WO$_3$), indium tin oxide (ITO), indium gallium zinc oxide (InGaZnOx), gallium oxide (Ga$_2$O$_3$), and indium oxide (In$_2$O$_3$). Examples of the compound semiconductor described above include indium-doped zinc oxide (IZO), aluminum-doped zinc oxide (ZAO), zinc oxide (ZnO), magnesium oxide (MgO), zinc magnesium oxide (ZnMgO), zinc sulfide (ZnS), zinc selenide (ZnSe), zinc sulfoselenide (ZnSSe), magnesium sulfide (MgS), magnesium selenide (MgSe), and magnesium sulfoselenide (MgSSe). Examples of the III-V compound semiconductor described above include aluminum arsenide (AlAs), gallium arsenide (GaAs), indium arsenide (InAs), and AlGaInAs, which is the mixed crystal of these; and aluminum nitride (AlN), gallium nitride (GaN), indium nitride (InN), and AlGaInN, gallium phosphide (GaP), and AlInGaP, which are the mixed crystals of these. Examples of the IV-IV compound semiconductor described above include semiconductors made of elements different from each other, such as silicon germanium (SiGe) and silicon carbide (SiC). These electron transport materials may be used alone or may be used in combination of two or more as appropriate.

As the material of the IL 4, a known general insulating material such as silicon oxide (SiO2), silicon nitride (SiN), and silicon oxynitride (SiON) may be used.

The EML 5 may include, for example, nano-sized quantum dots (hereinafter, "QDs") as the light-emitting material. As the QDs described above, known QDs can be employed. The QDs described above may include, for example, a semiconductor material formed of an element of at least one type selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). Further, the QDs described above may be a two-component core type, a three-component core type, a four-component core type, a core-shell type, or a core multi-shell type. Further, the QDs described above may include nanoparticles doped with at least one of the elements described above, or may include a composition gradient structure.

However, the present embodiment is not limited to the examples described above. The EML 5 may include, as the light-emitting material, an organic light-emitting material that emits light of each color in place of the QDs, for example.

In a case in which the light-emitting element 10 is a QLED that uses the QDs as the light-emitting material as described above, the holes and the electrons recombine in the EML 5 by a drive current between the anode 2 and the cathode 7. Then, light (fluorescence) is emitted as a result of excitons generated by the recombination transitioning from the conduction band level to the valence band level of the QDs.

On the other hand, in a case in which the light-emitting element 10 is an OLED that uses an organic light-emitting material as the light-emitting material, the holes and the electrons recombine in the EML 5 by a drive current between the anode 2 and the cathode 7. Then, light is emitted as a result of excitons generated by the recombination transitioning into a ground state.

Note that the light-emitting element 10 may be a light-emitting element other than the OLED or the QLED (such as an inorganic light-emitting diode, for example).

Next, the layer thickness of each layer in the light-emitting element 10 and a magnitude of the unevenness of the anode 2 and the HTL 3 will be described.

The anode 2 is formed so that a portion having the thickest layer thickness has a thickness greater than or equal to the layer thickness of the EML 5. The portion of the anode 2 having the thickest layer thickness is a portion where the protruding portion 2b is formed. Hereinafter, for convenience of explanation, the portion of the anode 2 having the thickest layer thickness is referred to as the "protruding portion formation portion of the anode 2". For example, the thickness of the EML 5 is often a few tens of nanometers, and is typically 50 nm. In this case, the protruding portion formation portion of the anode 2 is formed to a thickness of, for example, 50 nm, which is the layer thickness of the EML 5, or greater. Taking into consideration the post process of the manufacturing process of the anode 2, the layer thickness of the protruding portion formation portion of the anode 2 is preferably, in the case of the thickest thickness, three times the layer thickness of the EML 5 or less. That is, the layer thickness of the protruding portion formation portion of the anode 2 is suitably set within a range from one times to three times the layer thickness of the EML 5.

Note that the layer thickness of the anode 2 indicates a thickness of the anode 2 in a normal direction of the surface of the anode 2. Specifically, the layer thickness of the anode 2 indicates a distance between an upper face and a lower face of the anode 2. Accordingly, the layer thickness of the anode 2 in the recessed portion 2a indicates a thickness of a bottom wall of the recessed portion 2a. Further, the layer thickness of the anode 2 of the protruding portion 2b (that is, the layer thickness of the protruding portion formation portion of the anode 2) indicates the sum of a height of the protruding portion 2b and the thickness of the bottom wall of the recessed portion 2a.

The portion of the anode 2 having the thinnest layer thickness is the bottom wall of the recessed portion 2a. The layer thickness of the bottom wall of the recessed portion 2a can be set in the same way as the layer thickness of the anode in a light-emitting element in the related art that uses an anode as the lower electrode.

The layer thickness of the EML 5 is not particularly limited as long as it is a thickness capable of expressing a function of providing a place for recombination between the electrons and the holes to achieve light emission. In a case in which QDs are used for the EML 5, for example, the layer thickness of the EML 5 is preferably approximately several times an outermost particle size of the QDs.

The particle size of the QDs can be set in the same way as in the related art. The core particle size of the QDs is, for example, from 1 to 30 nm, and the outermost particle size of the QDs including the shell is, for example, from 1 to 50 nm. Further, the number of overlapping layers of the QDs in the light-emitting element 10 is, for example, from 1 to 20 layers.

However, because the luminous efficiency is lowered when the layer thickness of the EML 5 exceeds 100 nm based on results of experiments, the layer thickness of the EML 5 is desirably 100 nm or less. With a layer thickness exceeding 100 nm, the EML 5, when injecting electrons or holes, has difficulty injecting carriers across the entire layer thickness direction region of the EML 5.

As described above, the EML 5 is formed so that the height of the outermost surface of the EML 5 matches the height of the outermost surface of the IL 4. Therefore, as illustrated in FIG. 1, the layer thickness of the EML 5 is equal to the sum of a layer thickness 4h of the IL 4 and a height 3h of the protruding portion 3b. Accordingly, the sum of the layer thickness 4h and the height 3h is desirably 100 nm or less. Note that, as illustrated in FIG. 1, the height 3h of the protruding portion 3b is equal to the depth of the recessed portion 3a.

The layer thickness 4h is set to 10 nm or greater to avoid tunneling of the carriers injected into the EML 5. With the layer thickness 4h set to 10 nm or greater, the tunneling of the carriers can be reliably prevented, and current bypassing the EML 5 can be suppressed.

Note that, as the layer thickness 4h thickens, a tunneling probability is reduced by an exponential function of the layer thickness 4h. As long as the layer thickness 4h is 20 nm or greater, the tunnel probability is sufficiently low, making it possible to secure insulation between the HTL 3 and the ETL 6. Therefore, the layer thickness 4h is desirably 20 nm or greater.

Further, the height 3h affects carrier injection in the layer thickness direction of the EML 5. The height 3h is desirably 20 nm or greater. When the height 3h is 20 nm or greater, light emitted from the EML 5 is scattered by the protruding portions 3b, avoiding total reflection at an interface between the light-emitting element 10 and the atmosphere and improving the light extraction efficiency. Further, the height 3h of the protruding portion 3b is an order of about one-tenth of the light emission wavelength. Therefore, the light scattering at the protruding portion 3b is mainly Rayleigh scattering, and the degree of scattering is proportional to the inverse square of the height 3h. As a result, the lower the height 3h, the higher the scattering effect. However, due to a processing process, there is a limit to the height 3h that can be processed. Due to competition between this scattering effect and the processing process, the lower limit of the height 3h at which the highest scattering effect can be obtained on a processable scale is 20 nm. From the above, with the height 3h set to 20 nm or greater, the carrier injection efficiency is improved and, at the same time, improvement in the light extraction efficiency due to the scattering effect is realized, improving the EQE.

Accordingly, the sum of the layer thickness 4h and the height 3h is desirably from 30 nm to 100 nm, and more desirably from 40 nm to 100 nm. Therefore, the layer thickness of the EML 5 is desirably from 30 nm to 100 nm, and more desirably from 40 nm to 100 nm.

Note that, because the upper limit of the layer thickness of the EML 5 is equal to the sum of the layer thickness 4h and the height 3h as described above, the upper limit of the height 3h is 90 nm, which is obtained by subtracting 10 nm, which is the lower limit of the layer thickness 4h, from 100 nm, which is the upper limit of the layer thickness of the EML 5. Further, because the layer thickness 4h is desirably 20 nm or greater, the height 3h is more desirably 80 nm or less. Accordingly, although it depends on the processing method, the height 3h is desirably from 20 nm to 90 nm, and more desirably from 20 nm to 80 nm.

Further, an upper limit of the layer thickness 4h is determined by a maximum thickness at which carriers can be uniformly injected from the HIT 3 to the EML 5 in a case in which the height 3h is the minimum value or in a case in which the layer thickness of the EML 5 is the maximum value. The upper limit of the layer thickness 4h is desirably 50 nm, and more desirably 30 nm, taking into consideration the height 3h (in other words, the depth of the recessed portion 3a). Accordingly, the layer thickness 4h is desirably 10 nm or greater, and more desirably 20 nm or greater. Further, the layer thickness 4h is desirably 50 nm or less, and more desirably 30 nm or less.

Further, a distance 3W between the protruding portions 3b adjacent to each other (in other words, the width of the recessed portion 3a) is desirably, in a case in which QDs are used for the light-emitting material of the EML 5, for example, two times the particle size of the QDs or greater. In a case in which the distance 3W is narrower than the particle size, the recessed portion 3a cannot be filled with the QDs. In order to fill the recessed portion 3a with the QDs without gaps, desirably the distance 3W is a width equivalent to two times the particle size of the QDs or greater. Note that, for the same reason, the depth of the recessed portion 3a (in other words, the height 3h) is desirably the particle size of the QDs or greater.

Further, the distance 3W is desirably not less than 20 nm and not greater than one-half of the cross-sectional width of the light-emitting element 10 in the arrangement direction of the plurality of protruding portions 3b. With the distance 3W thus set, the light-emitting material of the EML 5 can be filled without gaps, and the EML 5 can favorably emit light.

In the present embodiment, the HTL 3 is suitably formed with a constant layer thickness. Therefore, the layer thickness of the HTL 3 of the protruding portion 3b and the layer thickness of the HTL 3 of the recessed portion 3a are the same.

Accordingly, the height 3h of the protruding portion 3b is equal to a height 2h of the protruding portion 2b. Note that the height 2h of the protruding portion 2b is equal to the depth of the recessed portion 2a. Therefore, the height 2h is desirably from 20 nm to 90 nm, and more desirably from 20 nm to 80 nm.

Further, a distance 2W between the protruding portions 2b adjacent to each other (in other words, the width of the recessed portion 2a) is a value obtained by subtracting the layer thickness of the 3 from the distance 3W. Accordingly, the distance 2W is set so that the distance 3W is within the range described above.

Note that the layer thickness of the HTL 3 indicates the thickness of the HTL 3 in the normal direction of the surface of the HTL 3. Specifically, the layer thickness of the HTL 3 indicates the distance between the surface on the anode 2 side and the surface on the EML 5 side of the HTL 3.

Further, the layer thickness of the HTL 3 of the protruding portion 3b indicates the layer thickness of a portion of the HTL 3 covering the surface of the protruding portion 2b of the anode 2. More specifically, the layer thickness of the HTL 3 of the protruding portion 3b indicates the thickness of a sidewall and the thickness of a top wall of the protruding portion 3b. Further, the layer thickness of the HTL 3 of the recessed portion 3b indicates the layer thickness of a portion of the HTL 3 covering a surface other than the protruding portion 2b of the anode 2. More specifically, the layer thickness of the HTL 3 of the recessed portion 3a indicates the thickness of a bottom wall of the recessed portion 3a.

Note that the HTL 3 need only be configured so that the height 3h and the distance 3W are within the ranges described above. The layer thickness itself of the HTL 3 is not particularly limited as long as it is a thickness at which the hole transport function is sufficiently exhibited. The layer thickness of the HTL 3 can be set in the same way as the layer thickness of an HTL in a known self-light-emitting element for a display panel in the related art.

Similarly, the layer thickness of the ETL 6 is not particularly limited as long as it is a thickness at which the electron transport function is sufficiently exhibited. The layer thickness of the ETL 6 can be set in the same way as the layer thickness of an ETL in a known self-light-emitting element for a display panel in the related art.

Further, the layer thickness of the cathode 7 is not particularly limited, and can be set in the same way as the layer thickness of a cathode in a light-emitting element in the related art that uses a cathode as the upper electrode.

Note that, in the disclosure, when not specifically described, the layer thickness of each layer is assumed to indicate the thickness of each layer in the normal direction of the surface of each layer.

Figure 5:
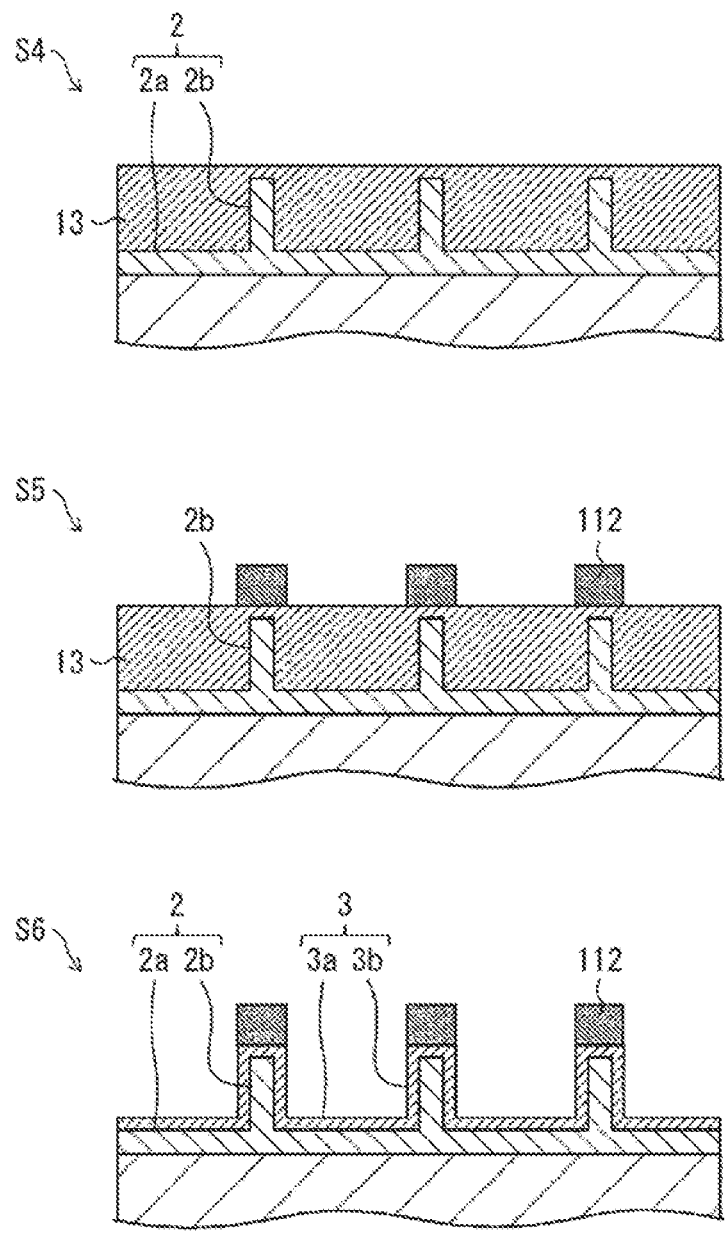
FIG. 5 is another cross-sectional view illustrating, in order, a portion of a process for manufacturing the light-emitting element of the display device according to the first embodiment.
Figure 6:
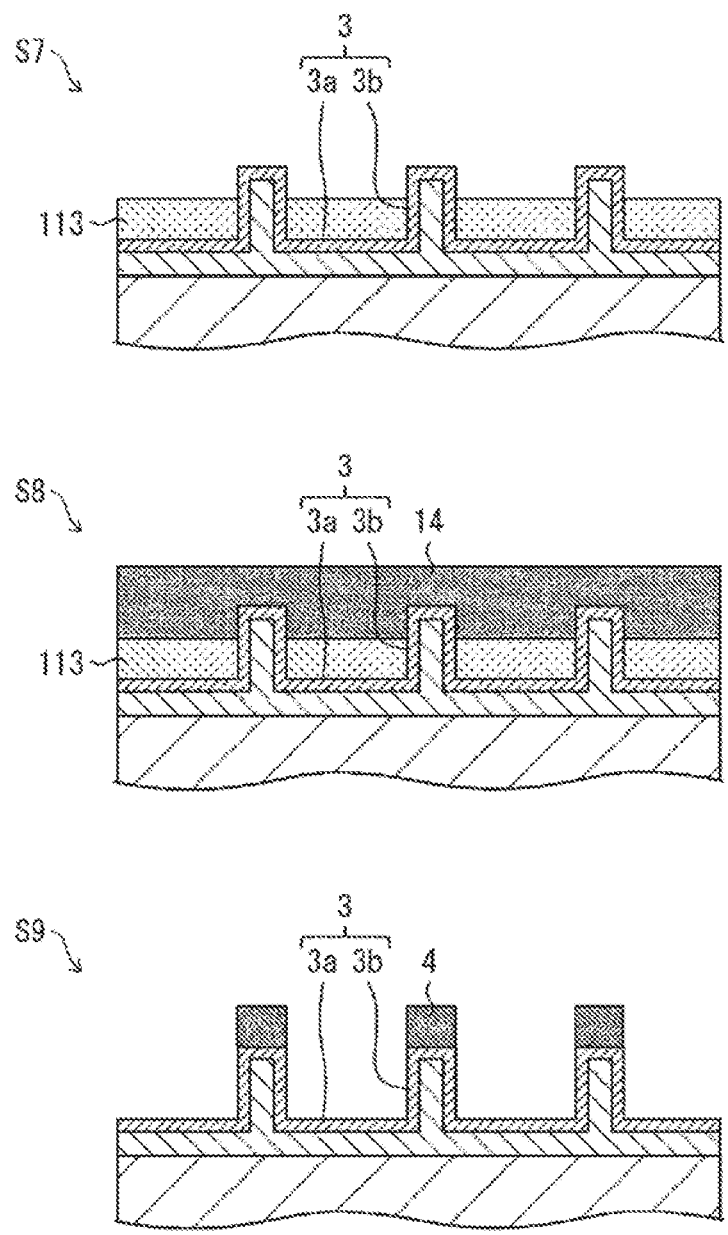
FIG. 6 is yet another cross-sectional view illustrating, in order, a portion of a process for manufacturing the light-emitting element of the display device according to the first embodiment.
Figure 7:
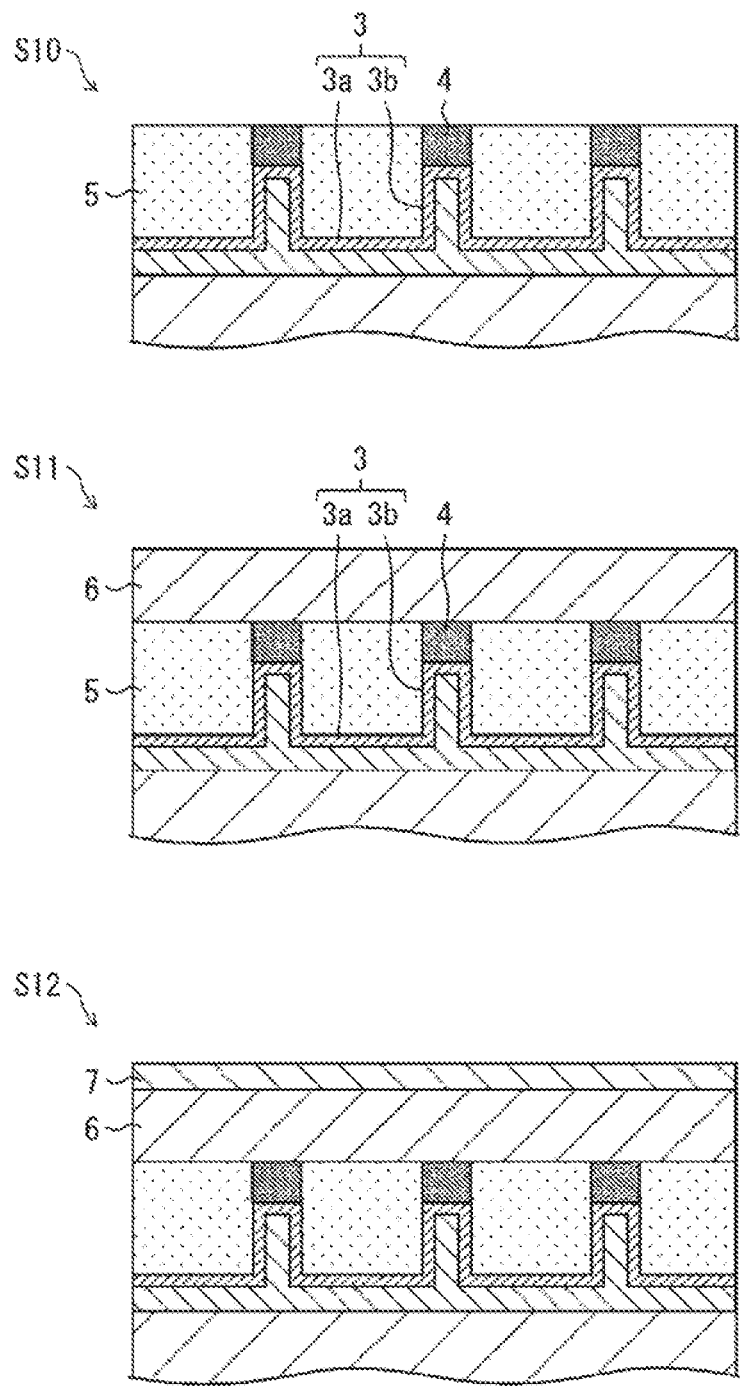
FIG. 7 is yet another cross-sectional view illustrating, in order, a portion of a process for manufacturing the light-emitting element of the display device according to the first embodiment.

Next, a method of manufacturing the light-emitting element 10 according to the present embodiment in the manufacture of the display device 100 will be described below with reference to FIG. 4 to FIG. 7. FIG. 4 to FIG. 7 are cross-sectional views illustrating, in order, a portion of a process for manufacturing the light-emitting element 10 of the display device 100 according to the present embodiment. Note that FIG. 4 to FIG. 7 illustrate a cross section of the display device 100 corresponding to the cross section of the light-emitting element 10 illustrated in FIG. 1. FIG. 5 illustrates a manufacturing process after the manufacturing process illustrated in FIG. 4. FIG. 6 illustrates a manufacturing process after the manufacturing process illustrated in FIG. 5. FIG. 7 illustrates a manufacturing process after the manufacturing process illustrated in FIG. 6.

Figure 4:
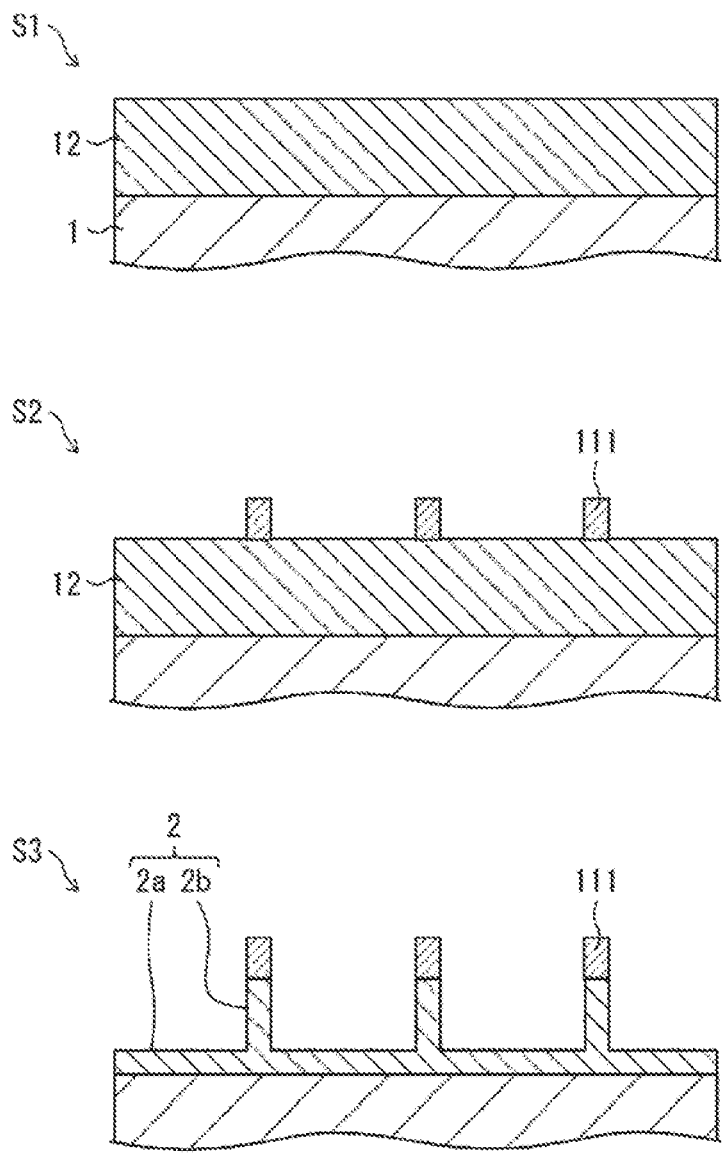
FIG. 4 is a cross-sectional view illustrating, in order, a portion of a process for manufacturing the light-emitting element of the display device according to the first embodiment.

First, as illustrated in S1 in FIG. 4, the substrate 1 serving as a support body is prepared, and a conductive layer 12 composed of a conductive material and to serve as the anode 2 is formed on the substrate 1 (step 1). At this time, in a case in which the light-emitting element 10 is part of the display device 100 as described above, the conductive layer 12 is patterned in an island shape for each pixel P so as to be in contact with a drain electrode of each TFT.

As described above, the layer thickness of the anode 2 is suitably set within a range from one time to three times the layer thickness of the EML 5. Accordingly, the layer thickness of the conductive layer 12 is set within the range described above so that the layer thickness of the anode 2 is within the range described above. As described above, for example, the thickness of the EML 5 is often a few tens of nm, and is often typically 50 nm. In this case, the conductive layer 12 is formed to a thickness of, for example, 50 nm or greater.

The substrate 1 may be prepared in advance by a known TFT process, or a commercially available array substrate may be used. The substrate 1 can be prepared, for example, by the following method. First, a TFT layer including TFTs and a plurality of wiring lines is formed on an insulating substrate by a known method. Next, a flattened layer formed of a photosensitive resin is formed on the TFT layer described above by a known method. Subsequently, contact holes for connecting the anode 2 to the drain electrodes of the TFTs are formed in the flattened layer described above. Thus, the substrate 1 provided with the plurality of TFTs is formed.

Note that vapor deposition or sputtering may be used for film formation of the conductive layer 12 (in other words, film formation of the anode 2). The conductive layer 12 serving as the anode 2 is connected to the drain electrodes of the TFTs via contact holes formed in the flattened layer described above.

Next, as illustrated in S2 in FIG. 4, a mask 111 for processing a surface of the conductive layer 12 into an uneven shape is formed on the conductive layer 12 (step S2).

As the mask 111, a resist pattern by general photolithography may be formed or, instead of the resist pattern, the surface may be simply covered with a metal mask.

After formation of the mask 111, as illustrated in S3 in FIG. 4, the conductive layer 12 is etched by wet etching or dry etching, and thus the surface of the conductive layer 12 is processed into an uneven shape.

As a result, the anode 2 having unevenness composed of the recessed portion 2a and the protruding portion 2b on the surface is formed (step S3). Specifically, in a plan view, regions of the surface of the conductive layer 12 not covered by the mask 111 are etched, forming the recessed portions 2a in the regions. Thus, the protruding portions 2b are formed in the regions of the surface of the conductive layer 12 covered by the mask 111 in a plan view and not etched.

Note that, in a case in which the light-emitting element 10 is part of the display device 100 as described above, the bank BK is then formed covering the peripheral edge portion of the anode 2, as illustrated in FIG. 3. At this time, in the present embodiment, for example, the bank BK is formed so that a height of an upper face, that is, an outermost surface, of the bank BK, matches a height of an upper face, that is, an outermost surface, of the IL 4.

Next, as illustrated in S4 in FIG. 5, the mask 111 is removed, and a hole transport material layer 13 formed of the hole transport material and serving as the HTL 3 is formed on the anode 2 (step S4). At this time, in a case in which the light-emitting element 10 is part of the display device 100 as described above, the hole transport material layer 13 is patterned in an island shape for each pixel P.

For film formation of the hole transport material layer 13 (in other words, film formation of the HTL 3), sputtering, vapor deposition, colloidal solution application, or the like can be used. Note that the layer thickness of the hole transport material layer 13 is related to the post process, and desirably is a thickness greater than or equal to the height 2h of the protruding portion 2b (which equals the depth of the recessed portion 2a; refer to FIG. 1). In other words, the layer thickness of the hole transport material layer 13 is set to a thickness greater than or equal to the height 3h of the protruding portion 3b. Note that, in the present embodiment, to distinguish the layer thickness of the final HTL 3 after formation of the uneven pattern and the layer thickness of the hole transport material layer 13, the HTL 3 before formation of the uneven pattern is referred to as the "hole transport material layer 13". Similarly, as described above, the anode 2 before formation of the uneven pattern is referred to as the "conductive layer 12", making a distinction from the final anode 2 after formation the uneven pattern.

Next, as illustrated in S5 in FIG. 5, a mask 112 for processing a surface of the hole transport material layer 13 into an uneven shape along the surface of the anode 2 is formed on the hole transport material layer 13 (step S5).

As the mask 112, a mask similar to the mask 111 can be used, only the mask 112 is formed slightly larger than the mask 111 in a plan view.

The mask 112 is formed on the surface of the hole transport material layer 13, overlapping the protruding portions 2b in a plan view. Being formed slightly larger than the mask 111 in a plan view, the mask 112 is formed slightly larger than the protruding portions 2b.

Next, as illustrated in S6 in FIG. 5, the hole transport material layer 13 is etched by wet etching or dry etching, and thus the surface of the hole transport material layer 13 is processed into an uneven shape along the surface of the anode 2.

As a result, the HTL 3 having unevenness composed of the recessed portion 3a and the protruding portion 3b is formed on the surface (step S6). Specifically, in a plan view, regions of the surface of the hole transport material layer 13 not covered by the mask 112 are etched, forming the recessed portions 3a in the regions. Thus, the protruding portions 3b are formed in the regions of the surface of the hole transport material layer 13 covered by the mask 112 in a plan view and not etched.

At this time, in the present embodiment, an etching time is controlled so that the layer thickness of the HTL 3 after etching is substantially constant. That is, in the present embodiment, the etching time is controlled so that the thickness of the sidewall of the protruding portion 3b, the thickness of the top wall of the protruding portion 3b, and the thickness of the bottom wall of the protruding portion 3a are substantially the same. Thus, the recessed portion 3a and the protruding portion 3b geometrically similar to the recessed portion 2a and the protruding portion 2b are formed.

Next, as illustrated in S7 in FIG. 6, the mask 112 is removed, and a new mask 113 for forming the IL 4 on the protruding portions 3b is formed in the recessed portions 3a (step S7). Note that the mask 113 can be formed in the same way as the masks 111, 112 using the same materials as those of the masks 111, 112.

Next, as illustrated in S8 in FIG. 6, an insulating film 14 serving as the IL 4 is formed covering the HTL 3 and the mask 113 (step S8).

The insulating film 14 can be formed using various methods known in the related art as insulator layer formation methods, such as sputtering, vapor deposition, or coating, for example.

Next, as illustrated in S9 in FIG. 7, the mask 113 is removed, and thus the insulating film 14 in the recessed portions 3a is lifted off. Thus, the IL 4 composed of the insulating film 14 is formed on the protruding portions 3b (step S9).

By the removal of the insulating film 14 in the recessed portions 3a, the IL 4 thus formed overlaps the protruding portions 3b and has the same shape as the protruding portions 3b in a plan view.

Next, as illustrated in S10 in FIG. 7, the EML 5 is formed in the recessed portions 3a, each including the IL 4 and the protruding portion 3b in a portion of the sidewall (step S10).

More specifically, in a space including the recessed portion 3a surrounded by the layered body of the protruding portion 3b and the IL 4 as well as the bank BK (not illustrated), the EML 5 is formed so that the height of the outermost surface of the 5 matches the height of the outermost surface of the IL 4 and the height of the outermost surface of the bank BK.

At this time, in a case in which the light-emitting element 10 is part of the display device 100 as described above, the EML 5 having a red light emission peak is formed in the pixel RP. The EML 5 having a green light emission peak is formed in the pixel GP. The EML 5 having a blue light emission peak is formed in the pixel BP.

In a case in which the EML 5 is a QD layer including QDs, for example, the EML 5 can be formed by spin coating a colloidal solution in which the QDs are dispersed, or the like. At this time, the conditions of spin coating are adjusted so that the outermost surface of the EML 5 and the outermost surface of the IL 4 are flush.

Note that, depending on the viscosity or surface tension of the colloidal solution, the outermost surface of EML 5 may not reach the same height as the outermost surface of IL 4 if the colloidal solution is only applied once. In this case, it is sufficient to perform heat curing after the first application of the colloidal solution, and then apply a second application of the colloidal solution. Alternatively, the viscosity of the colloidal solution may be adjusted, shifting the viscosity to the high viscosity side. This allows an upper face (outermost surface) of the EML 5 to be flat or close to flat.

Next, as illustrated in S11 in FIG. 7, the ETL 6 is formed on the IL 4 and the EML 5 (step S11). At this time, in a case in which the light-emitting element 10 is part of the display device 100 as described above, the ETL 6 is formed as a common layer common to each pixel P, for example, as described above.

For the film formation method of the ETL 6, various methods known as ETL film formation methods in the related art can be used, such as sputtering, vapor deposition, and colloidal solution application.

Next, as illustrated in S12 in FIG. 7, the cathode 7 is formed on the ETL 6 (step S12). At this time, in a case in which the light-emitting element 10 is part of the display device 100 as described above, the cathode 7 is formed as a common layer common to each pixel P as described above.

Note that, for film formation of the cathode 7, various methods known as cathode film formation methods in the related art can be used, such as vapor deposition or sputtering. Thus, the light-emitting element 10 according to the present embodiment is manufactured.

The display device 100 is manufactured by pixel wiring lines and sealing the light-emitting elements 10 by the sealing layer 8 after step S12 described above. Note that a function film may be bonded onto the sealing layer 8, and an electronic circuit board may be mounted in a non-display region. Further, after formation of the sealing layer 8 described above, the display device 100 described above may be made flexible by bonding an upper face film onto the sealing layer 8 and peeling off a support substrate such as a glass substrate to bonding a lower face film. Further, a large substrate such as a mother glass may be used as the support substrate described above, and partitioning may be performed before bonding the function film.

Next, an effect of the light-emitting element 10 according to the present embodiment will be described.

Figure 8:
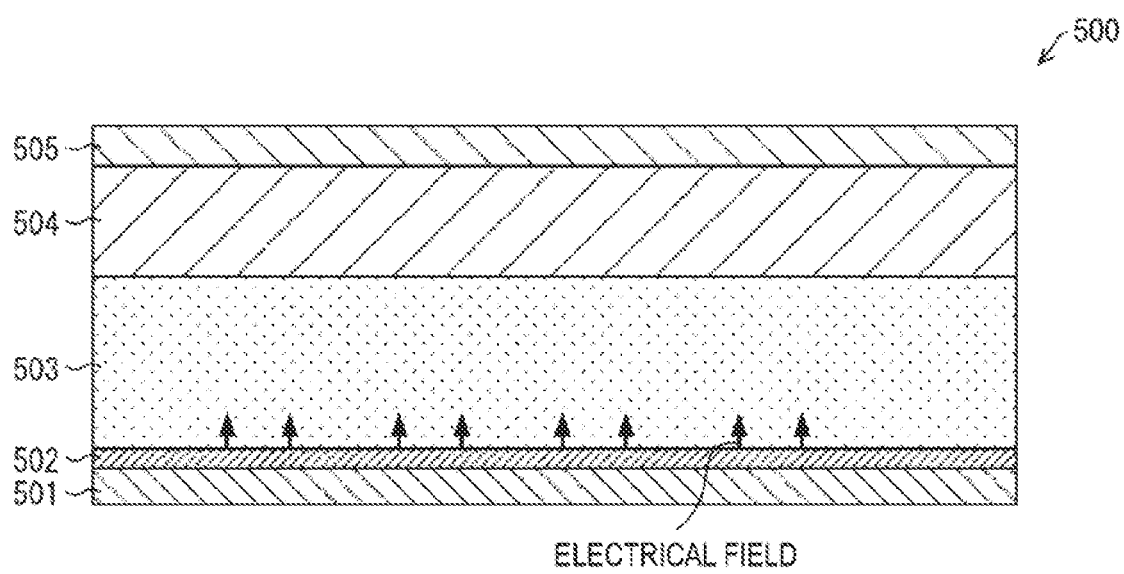
FIG. 8 is a cross-sectional view illustrating a schematic configuration of a typical light-emitting element in the related art.

FIG. 8 is a cross-sectional view illustrating a schematic configuration of a typical light-emitting element 500 in the related art. As with the light-emitting element described in PTL 1, the light-emitting element 500 illustrated in FIG. 8 has a configuration in which an anode 501, an HTL 502, an EML 503, an ETL 504, and a cathode 505 are provided in this order from a lower layer side, each having a flat shape in a cross-sectional view.

Specifically, as illustrated in FIG. 8, the light-emitting element 500 in the related art has a configuration in which the anode 501 and the cathode 505 facing each other are parallel flat plate electrodes. In the light-emitting element 500, unlike the light-emitting element 10, a surface of the anode 501 and a surface of the HTL 502 are each flat, and an interface in contact with the anode 501 and the HTL 502 is flat across the entire region of the light-emitting element 500.

In such a light-emitting element 500, as illustrated in FIG. 8, an electric field from the surface of the HTL 502 toward the EML 503 is only in a direction parallel to the layer thickness direction of the EML 503, and holes are injected in a direction parallel to the layer thickness direction of the EML 503.

In contrast, according to the present embodiment, as illustrated in FIG. 1, the HTL 3 includes the protruding portions 3b, thereby increasing a contact area between the HTL 3 and the EML 5 and expanding an area in which the holes are transported by the HTL 3. Further, as illustrated in FIG. 1, the electric field from the surface of the HTL 3 toward the EML 5 is distributed along the shape of the HTL 3. Specifically, the electric field from the surface of the HTL 3 toward the EML 5 is distributed in the normal direction of the surfaces of the recessed portions 3a and the protruding portions 3b of the HTL 3. Therefore, the light-emitting element 10 has a large electric field distribution compared to that of the light-emitting element 500 in the related art which the protruding portion 3b is not provided on the surface of the HTL 3. Therefore, according to the present embodiment, holes can be injected not only in the direction parallel to the layer thickness direction of the EML 5, but at a wide angle in the surface of the EML 5. Therefore, according to the present embodiment, the hole injection efficiency is improved over that in the related art.

Figure 9:
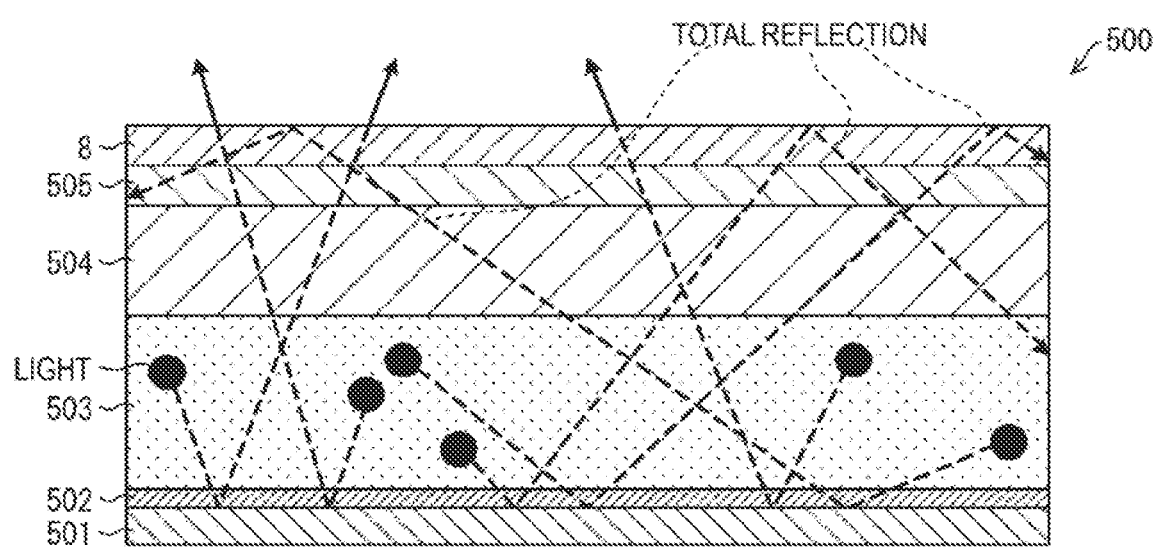
FIG. 9 is a cross-sectional view illustrating a scattered state of light emitted by the light-emitting element illustrated in FIG. 8.
Figure 10:
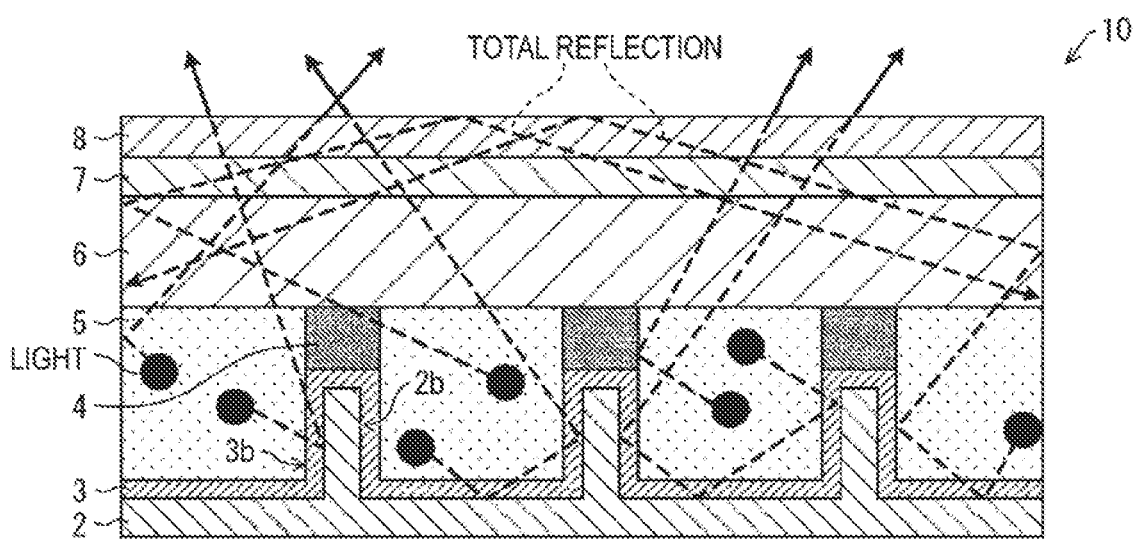
FIG. 10 is a cross-sectional view illustrating a scattered state of light emitted by the light-emitting element illustrated in FIG. 1.

Further, FIG. 9 is a cross-sectional view illustrating a scattered state of light emitted by the light-emitting element 500 illustrated in FIG. 8, FIG. 10 is a cross-sectional view illustrating a scattered state of light emitted by the light-emitting element 10 illustrated in FIG. 1.

FIG. 9 illustrates a case in which the sealing layer 8 is provided on the light-emitting element 500 illustrated in FIG. 8 as an example. Further, FIG. 10 illustrates a case in which the sealing layer 8 is provided on the light-emitting element 10 illustrated in FIG. 1 as an example.

As illustrated in FIG. 9, of the light emitted by the light-emitting element 500, the light reflected at an angle outside the total reflection angle of the interface between the sealing layer 8 and the atmosphere is extracted from the light-emitting element 500 to the outside. Similarly, as illustrated in FIG. 10, of the light emitted by the light-emitting element 10, the light reflected at an angle outside the total reflection angle of the interface between the sealing layer 8 and the atmosphere is extracted from the light-emitting element 10 to the outside.

As illustrated in FIG. 10, according to the light-emitting element 10, light is scattered by the anode 2 and the sidewalls of the protruding portions 2b, 3b of the HTL 3. Therefore, according to the light-emitting element 10, the scattered light is increased compared to that of the light-emitting element 500 illustrated in FIG. 9, and the scattered light is multi-reflected. As a result, light normally reflected at a shallow angle and not emitted to the outside is, while being multi-reflected a plurality of times, emitted to the outside at an angle that can avoid total reflection at the interface between the sealing layer 8 and the atmosphere. Therefore, according to the present embodiment, the light extraction efficiency is improved over that in the related art.

Furthermore, according to the present embodiment, the IL 4 is provided between the protruding portion 3b and the ETL 6 facing the protruding portion 3b, where the tin, 3 and the ETL 6 are closest, making it possible to insulate the HTL 3 and the ETL 6. This also makes it possible to prevent an electric field concentration between the HTL 3 and the ETL 6. As a result, it is possible to prevent the generation of a large local electric field and thus prevent the breakdown of the EML 5.

Note that, at this time, the IL 4 is provided in contact with the protruding portions 3b and the ETL 6 as illustrated in FIG. 1, making it possible to more reliably prevent an electric field concentration between the HTL 3 and the ETL 6, and more reliably prevent the generation of a large local electric field. This makes it possible to more reliably prevent the breakdown of the EML 5. Further, the electric field distribution on the protruding portion 3b can be more reliably eliminated, making it possible to uniformly inject the carriers from the HTL 3 into the EML 5.

Figure 11:
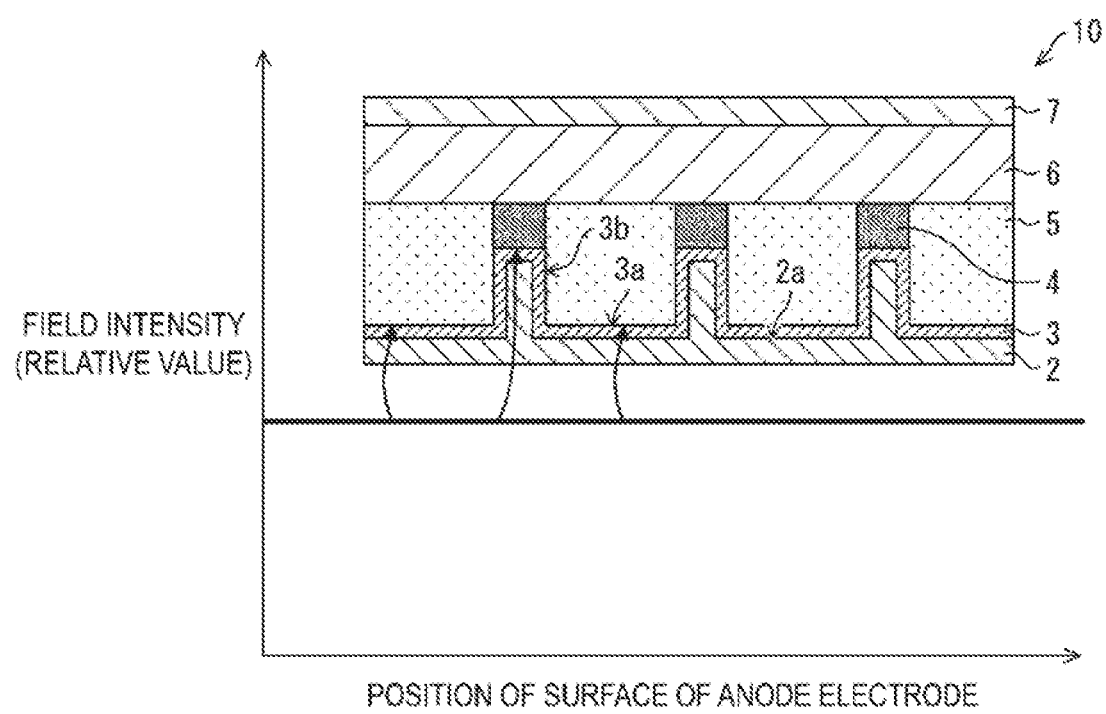
FIG. 11 is a drawing illustrating a field intensity along a surface of a hole transport layer of the light-emitting element illustrated in FIG. 1.

FIG. 11 is a drawing illustrating a field intensity along a surface of the HTL 3 of the light-emitting element 10 illustrated in FIG. 1. Note that, in FIG. 11, the horizontal axis indicated as "Position of surface of anode" does not indicate the position of the uneven slopes of the anode 2, but simply the position when the bottom wall of the recessed portion 2a of the anode 2 is horizontally crossed.

Furthermore, in the present embodiment, as described above, the layer thickness of the HTL 3 is constant regardless of location, and the HTL 3 has the same layer thickness in the recessed portion 3a and the protruding portion 3b. Therefore, as illustrated in FIG. 11, in the light-emitting element 10, the field intensity of the electric field applied between the HTL 3 and the EML 5 does not fluctuate within the HTL 3 and cause in-plane distribution, but rather is substantially constant throughout the cross section of the light-emitting element 10.

Therefore, according to the present embodiment, when an external electric field is applied to the light-emitting element 10 to inject holes from the HTL 3 into the EML 5, the holes can be uniformly injected across the entire in-plane region of the EML 5. Further, there is no region where the transport efficiency of the holes injected from the HTL 3 into the EML 5 is reduced, making it possible to maintain a constant carrier balance between the electrons and the holes. Moreover, because there is no distribution in field intensity, element breakdown of the light-emitting element 10 due to an electric field concentration can be prevented.

Figure 12:
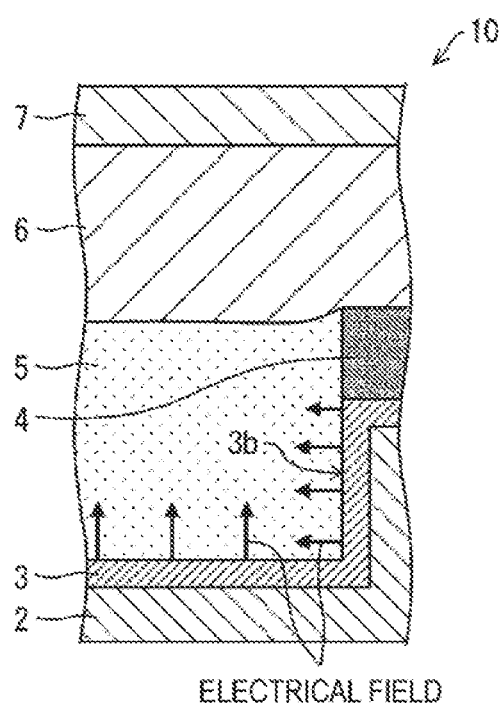
FIG. 12 is a cross-sectional view illustrating an example of a schematic configuration of the main portions of the light-emitting element illustrated in FIG. 1, together with an electric field distribution.
Figure 13:
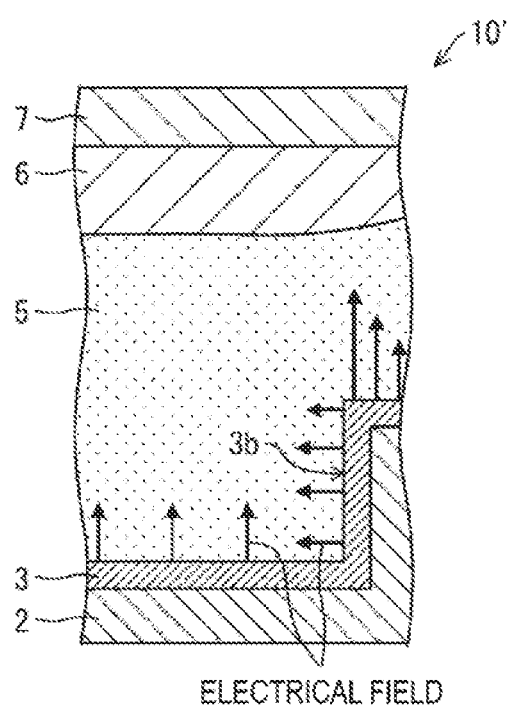
FIG. 13 is a cross-sectional view illustrating a schematic configuration of main portions of a light-emitting element for comparison in which an insulator layer is not provided in the light-emitting element illustrated in FIG. 1, together with an electric field distribution.

Further, FIG. 12 is a cross-sectional view illustrating an example of a schematic configuration of the main portions of the light-emitting element 10 illustrated in FIG. 1 together with the electric field distribution. FIG. 13 is a cross-sectional view illustrating a schematic configuration of main portions of a light-emitting element 10' for comparison in which the IL 4 is not provided in the light-emitting element 10 illustrated in FIG. 1 together with the electric field distribution. Note that FIG. 13 illustrates a case in which the IL 4 is not provided in the light-emitting element 10 illustrated in FIG. 12 as an example.

As described above, depending on the viscosity or the surface tension of the colloidal solution used in the EML 5, for example, the outermost surface of the EML 5 may not reach the same height as that of the outermost surface of the IL 4. In this case, the outermost surface of the EML 5 can be made flat or close to flat by reapplying the colloidal solution or adjusting the viscosity of the colloidal solution. Nevertheless, as illustrated in FIG. 12, the outermost surface of the EML 5 is not completely flattened, and the outermost surface of the EML 5 may rise at or near the interface between the outermost surface of the EML 5 and the outermost surface of the IL 4. Similarly, as illustrated in FIG. 13, in a case in which the IL 4 is not formed, the outermost surface of the EML 5 may rise in and near the formation region of the protruding portion 3b.

In this case, according to the present embodiment, as illustrated in FIG. 12, the electric field at or near the outermost surface of the HTL 3 is only slightly reduced in the region where the outermost surface of the EML 5 rises.

Nevertheless, as illustrated in FIG. 13, in a case in which the IL 4 is not formed, the field intensity of the top wall portion of the protruding portion 3b is high compared to that of other portions, and electric field distribution occurs on the protruding portion 3b as well due to the rise of the outermost surface of the EML 5. Accordingly, in a case in which the structure illustrated in FIG. 13 is applied to an OLED, for example, carrier injection occurs preferentially on the protruding portion 3b, causing light emission to be non-uniform.

On the other hand, according to the present embodiment, as described above, the IL 4 is formed on the protruding portion 3b, and unevenness is provided on the surface of the anode 2 and the HTL 3 so that the surface shapes of the anode 2 and the HTL 3 are geometrically similar. Therefore, according to the present embodiment, selective carrier injection from the protruding portion 3b can be suppressed, and the distance between the surface of the anode 2 and the surface of the HTL 3 (in other words, layer thickness of the HTL 3) is constant. Therefore, according to the present embodiment, holes can be uniformly injected across the entire in-plane region of the EML 5 as described above.

Table 1 shows the results of comparing the element characteristics of the light-emitting element 10 and the light-emitting element 500.

TABLE 1

|  | LIGHT-EMITTING ELEMENT 10 | LIGHT-EMITTING ELEMENT 500 | IMPROVEMENT RATE |
|---|---|---|---|
| HOLE INJECTION EFFICIENCY | 0.98 | 0.87 | 1.13 |
| CARRIER BALANCE | 0.97 | 0.86 | 1.13 |
| INTERNAL QUANTUM EFFICIENCY (IQE) | 0.90 | 0.90 | 1.00 |
| LIGHT EXTRACTION EFFICIENCY | 0.29 | 0.22 | 1.30 |
| EXTERNAL QUANTUM EFFICIENCY (EQE) | 0.25 | 0.15 | 1.69 |

The parameters of the element structure of the light-emitting element 10 used in the evaluation are as follows.
Cathode electrode 7: Al, 50 nm
ETL 6: ZnO (film formed by nanoparticle application), 40 nm
EML 5: QD layer using CdSe for the core and ZnS for the shell, 60 nm, 550-nm light emission wavelength (green)
HTL 3: NiO (film formed by sputtering), 40 nm
IL 4: $Al_2O_3$ (film formed by sputtering), 20 nm
Anode electrode 2: ITO (film formed by sputtering), layer thickness of bottom wall of recessed portion 2a=30 nm, height 2h of protruding portion 2b=40 nm, distance 2W between protruding portions 2b=2 μm Note that the height 3h of the protruding portion 3b is the same as the height 2h of the protruding portion 2b. Further, the distance 3W between the protruding portions 3b is equal to the sum of the distance 2W between the protruding portion 2b and twice the layer thickness of the HTL 3.

Further, the parameters of the element structure of the light-emitting element 500 used in the evaluation are as follows.
Cathode electrode 505: Al, 50 nm
ETL 504: ZnO (film formed by nanoparticle application), 40 nm
EML 503: QD layer using CdSe for the core and ZnS for the shell, 60 nm, 550-nm light emission wavelength (green)
HTL 502: NiO (film formed by sputtering), 40 nm
Anode electrode 501: ITO (film formed by sputtering), 30 nm Further, the evaluation method and evaluation results of the characteristics shown in Table 1 are as follows.
Carrier Injection Efficiency To evaluate carrier injection efficiency, an electron only device (EOD), which allows the flow of electrons only, and a hole only device (HOD), which allows the flow of holes only, were prepared as dedicated light-emitting devices for measuring the injection of electrons alone and holes alone. In the EOD, a hole blocking layer serving as a barrier to holes was added to the respective element structures of the light-emitting element 10 and the light-emitting element 500 described above, on the anode side. Further, in the HOD, an electron blocking layer serving as a barrier to electrons was added to the respective element structures of the light-emitting element 10 and the light-emitting element 500 described above, on the cathode side. In such an EOD and an HOD, electrons or holes are respectively injected alone, and thus light emission due to recombination between electrons and holes does not occur. Therefore, by using the EOD and the HOD described above, it is possible to measure the current made only from electrons and the current made only from holes, respectively, and thus calculate the injection volume of the electrons alone and the holes alone. From the voltage-current characteristics (VI characteristics) measured by the EOD, the electron injection efficiency can be calculated by dividing the current value (charge flow=time derivative of charge) at each voltage by the charge of one electron, and converting the result to the number of electrons moved per unit time. Further, the hole injection efficiency can be similarly calculated from the V-I characteristics of the HOD. In both cases, as long as the V-I characteristics are the rectification characteristics according to Shockley's diode equation, the flow of electrons or holes that pass over the junction and are injected into the EML is observed, making it possible to calculate the injection volume per unit surface area of electrons and holes.

In a case in which the element structure of the light-emitting element 500 is used, electron injection efficiency ≥ hole injection efficiency. In contrast, according to the light-emitting element 10, unevenness is provided to the anode 2 and the HTL 3 and thus, as shown by "Improvement rate" in Table 1, the hole injection efficiency was improved by 13% relative to that of the light-emitting element 500.

Carrier Balance

The respective density profiles of holes and electrons with respect to the layer thickness of the QD layer were created and overlap integrals were found by using the mobility (diffusion length) of the QD layer with respect to electrons and holes as well as the electron density and the hole density calculated from the currents measured by the EOD and the HOD described above.

Specifically, the injection volume per unit surface area of electrons (electron density) determined by the EOD described above is denoted as De, and the injection volume per unit surface area of holes (hole density) determined by the HOD described above is denoted as Dh. Further, the diffusion length of electrons in the QD layer is denoted as Le, and the diffusion length of holes in the QD layer is denoted as Lh. Then, the thickness of the EML is denoted as d, the diffusion distance is denoted as x, and the diffusion distance x is plotted with the bonding interface between the ETL and the QD layer serving as the origin. However, measuring the exact diffusion length inside the QD layer is difficult. Therefore, as the diffusion lengths Le, Lh described above, the diffusion lengths of the carriers measured by phase contrast or the like using the same bulk material as that of the core of the QDs were employed. The core of the QDs can be considered defect-free. Accordingly, the diffusion lengths Le, Lh measured with the bulk material, while underestimated, are unproblematic in terms of practical use. In turn, the concentration change due to the diffusion of electrons is expressed by $De \cdot \exp(-x/Le)$. The concentration change due to the diffusion of holes is expressed by $Dh \cdot \exp\{-(d-x)/Lh\}$. Therefore, the overlap integral is determined by integrating the product of both over the diffusion distance x.

The carrier balance is indicated by the diffusion distance x at which the overlap of the concentrations of electron and holes based on the overlap interval described above is maximum (that is, the diffusion distance x at the peak position of the overlap integral described above).

The best carrier balance is a case in which the overlap integral is maximum at a center of the EML (that is, a case in which the center of the EML is the peak position of the overlap integral). The carrier balance in this case is expressed by $x=d/2$.

Accordingly, a ratio x/d of the diffusion distance x of the peak position of the overlap integral calculated by the method described above to the thickness d of the EML is an index of carrier balance. In the best case (that is, a case in which the recombination rate of electrons and holes is maximum at the center of the EML), x/d is ½. In a case in which the maximum value of the overlap integral is unevenly disposed on either the EML side or the HTL side, x/d varies between 0 and ½.

According to the light-emitting element 10, because the hole density in the QD layer improved compared to that of the light-emitting element 500, the carrier balance improved by 13% similarly to the hole injection efficiency, as shown by the "Improvement rate" in Table 1.

Light Extraction Efficiency

Light extraction efficiency was calculated by geometric optical ray tracing using analysis software used for the analysis of inorganic LEDs for lighting, for example, from the layer thickness, refractive index, and geometrical shape of each layer in which light propagates. In ray tracing, the light-emitting element is divided into a collection of rectangular micro-regions, for example, and the optical constants of each micro-region are set according to the actual element. Then, the incidence and emission, and absorption and reflection of light at the micro-region interface having different optical characteristics are traced by geometrical optics according to Lambert's cosine law and Lambert-Beers law. The density of the traced rays is set to a high density considered to be continuously distributed with respect to the size of the EML of the light-emitting element. The light extraction efficiency can be calculated by tracing the path of each ray and dividing the density of the rays reaching the outside of the light-emitting element by the density of the traced rays previously set to a density considered to be continuously distributed with respect to the size of the EML. Direct measurement of the path of light propagating inside the actual element is difficult, and thus light extraction efficiency cannot be actually measured. Nevertheless, with use of the method described above, the light extraction efficiency can be accurately determined by calculation.

According to the light-emitting element 10, as illustrated in FIG. 10, scattered light increases due to the unevenness of the anode 2 and the unevenness of the HTL 3, increasing the light outside the total reflection angle of the interface between the sealing layer and the atmosphere. As a result, as shown by the "Improvement rate" in Table 1, according to the light-emitting element 10, the light extraction efficiency is improved by 30% compared to that of the light-emitting element 500.

IQE and EQE

EQE, as described above, is expressed as EQE=Carrier injection efficiency×Carrier balance×Light extraction efficiency×IQE. Carrier injection efficiency, carrier balance, and light extraction efficiency can each be determined by the techniques described above.

Further, EQE can be determined directly by the ratio (photon density/carrier density) of the photon density determined from the brightness spectrum of light emission to the carrier density (injection volume per unit surface area of the carriers) calculated from the currents measured by the EOD and the HOD described above.

The photon density described above can be determined by dividing the integral of brightness of each wavelength by $e=h \cdot c/\lambda$. Note that, in the equation, e indicates photon energy, h indicates Planck's constant ($h=6.6260755 \times 10^{-34}$ IS), c indicates the speed of light, and $\lambda$ indicates wavelength.

Accordingly, IQE can be calculated from the equation described above by determining the EQE, the carrier injection efficiency, the carrier balance, and the light extraction efficiency from the techniques described above.

Note that, because the light emission recombination probability of the QDs themselves and the density of the non-light-emitting center are unique to the QDs and do not change due to external factors, these values are constants that do not depend on, for example, the magnitude of the applied electric field or the magnitude of the injection carriers. Accordingly, regardless of carrier injection, as shown in Table 1, the IQE was unchanged between the light-emitting element 500 and the light-emitting element 10.

On the other hand, as for EQE, as shown by the "Improvement rate" in Table 1, according to the light-emitting element 10, the light extraction efficiency is improved by 69%, from 0.15 to 0.25, compared to that of the light-emitting element 500. This is conceivably because the hole injection efficiency increases due to the electric field along the sidewalls of the protruding portions 3b of the HTL 3 and the light is scattered by the sidewalls of the protruding portions 3*b*, improving the light extraction efficiency.

Modified Examples

FIG. 14 to FIG. 17 are each a main portion perspective view illustrating examples of the shape of the protruding portion 3*b* and the shape of the IL 4 when the light-emitting element 10 illustrated in FIG. 1 is viewed from above. Note that, in FIG. 14 to FIG. 17, for convenience of illustration, illustration of the ETL 6 and the cathode 7 is omitted.

Figure 14:
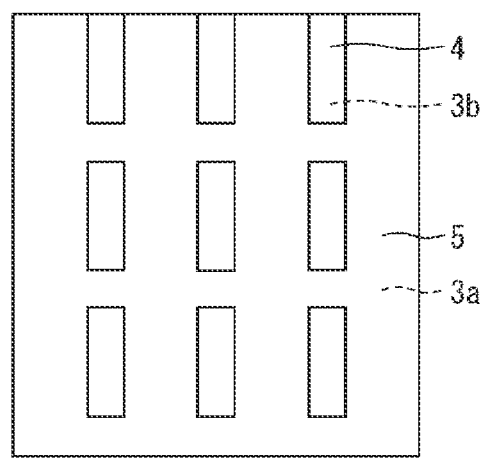
FIG. 14 is a main portion perspective view illustrating another example of the shape of the protruding portion of the hole transport layer and the shape of the insulator layer when the light-emitting element illustrated in FIG. 1 is viewed from above.

As described above, the IL 4 is formed on the protruding portion 3*b* in the same shape as that of the protruding portion 3*b*. Further, although not illustrated, as described above, the protruding portion 3*b* is formed along the protruding portion 2*b* and has a shape geometrically similar to that of the protruding portion 2*b*. In FIG. 2, a case in which the protruding portion 3*b* and the IL 4 are each formed in a stripe shape in a plan view is illustrated as an example. Nevertheless, the shapes of the protruding portion 3*b* and the IL 4 are not limited to the shapes illustrated in FIG. 2. The protruding portions 3*b* and the IL 4 may be formed in an intermittent line shape, and may each be formed in a matrix shape in a plan view, as illustrated in FIG. 14, for example.

Figure 15:
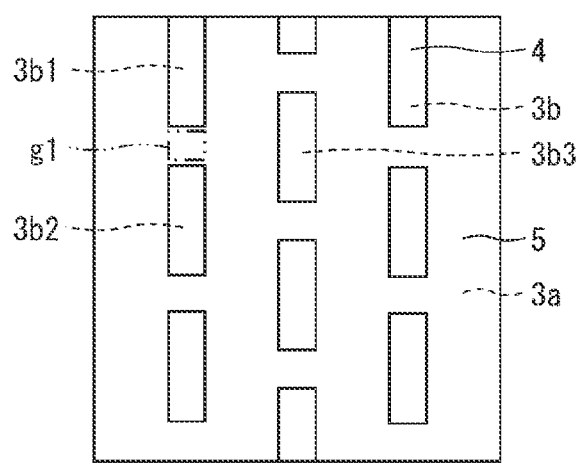
FIG. 15 is a main portion perspective view illustrating yet another example of the shape of the protruding portion of the hole transport layer and the shape of the insulator layer when the light-emitting element illustrated in FIG. 1 is viewed from above.

Further, as illustrated in FIG. 15, the protruding portions 3*b* and the IL 4 may each be formed in a zigzag shape in a plan view. Further, in FIG. 15, for example, the protruding portions 3*b* adjacent to each other in a column direction (first direction) are referred to as a protruding portion 3*b*1 and a protruding portion 3*b*2. Then, for each of these protruding portion 3*b*1, 3*b*2, the protruding portions 3*b* adjacent to each other in a row direction (second direction) perpendicular to the column direction are denoted as protruding portions 3*b*3, and a gap between the protruding portion 3*b*1 and the protruding portion 3*b*2 is denoted as a gap g1. In this case, when the gap g1 and the protruding portion 3*b*3 are adjacent to each other in the row direction, an electric field can be applied uniformly between each of the protruding portions 3*b* adjacent to each other, and the carriers can be uniformly injected into the EML 5. Note that, in this case as well, the IL 4 is formed on the protruding portion 3*b* in the same shape as that of the protruding portion 3*b* as described above.

Figure 16:
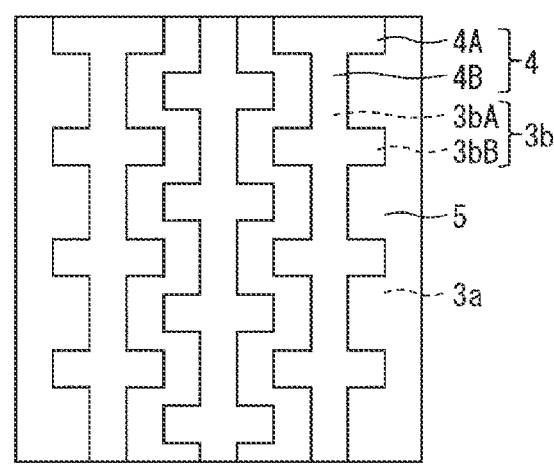
FIG. 16 is a main portion perspective view illustrating yet another example of the shape of the protruding portion of the hole transport layer and the shape of the insulator layer when the light-emitting element illustrated in FIG. 1 is viewed from above.

Further, desirably the protruding portion 3*b*, as illustrated in FIG. 16, has a fishbone shape including a trunk line portion 3*b*A and a plurality of branch line portions 3*b*B extending in an in-plane direction from the trunk line portion 3*b*A, in a plan view. Further, in this case, more desirably the branch line portions 3*b*B provided to one and the branch line portions 3*b*B provided to the other of the protruding portions 3*b* adjacent to each other are alternately arranged.

As described above, the protruding portion 3*b* has a fishbone shape and, in comparison to a case in which the protruding portion 3*b* does not include the branch line portion 3*b*B, a contact area between the protruding portion 3*b* and the EML 5 is increased and the area in which the holes are transported by the HTL 3 is expanded. As a result, the hole injection efficiency can be further improved.

Further, by alternately arranging the branch line portions 3*b*B provided to one and the branch line portions 3*b*B provided to the other of the protruding portions 3*b* adjacent to each other, it is possible to inject holes more uniformly in the in-plane direction from the HTL 3 into the EML 5.

However, the branch line portions 3*b*B provided to one and the branch line portions 3*b*B provided to the other of the protruding portions 3*b* adjacent to each other may be disposed facing each other in an extending direction of each branch line portion 3*b*B, and need not necessarily be disposed in an alternating manner.

Note that in a case in which the protruding portion 3*b* has a fishbone shape, the IL 4 also has a fishbone shape. Accordingly, the IL 4, as illustrated in FIG. 16, has a fishbone shape including a trunk line portion 4A and a plurality of branch line portions 4B extending in an in-plane direction from the trunk line portion 4A, in a plan view.

Figure 17:
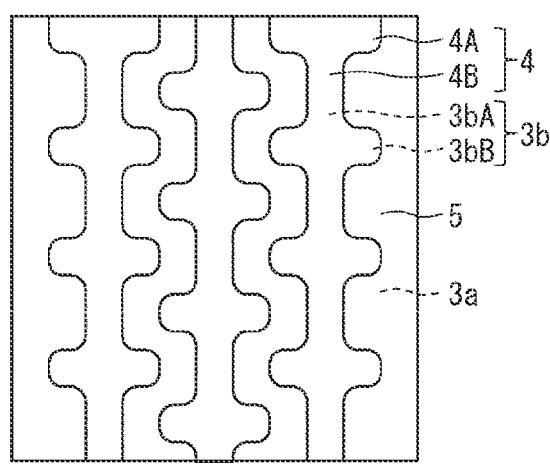
FIG. 17 is a main portion perspective view illustrating yet another example of the shape of the protruding portion of the hole transport layer and the shape of the insulator layer when the light-emitting element illustrated in FIG. 1 is viewed from above.

Further, as illustrated in FIG. 17, desirably the protruding portion 3*b* and the IL 4 have curved corner portions in a plan view. In other words, in a plan view, desirably, the protruding portion 3*b* and the IL 4 have a shape in which the corners where the straight lines meet are eliminated in a plan view. As a result, local electric field concentrations at the corner portions of the protruding portion 3*b* and the IL 4 can be avoided. Note that the protruding portion 3*b* includes curved corner portions in a plan view, and thus the recessed portion 3*a* also includes curved corner portions in a plan view.

Note that although FIG. 17 illustrates a case in which the protruding portion 3*b* and the IL 4 illustrated in FIG. 16 include curved corner portions in a plan view as an example, the present embodiment is not limited thereto. For example, the protruding portion 3*b* and the IL 4 illustrated in FIG. 14 or FIG. 15 may include curved corner portions in a plan view. Further, although not illustrated, the protruding portion 3*b* and the IL 4 may be formed in a circular shape, for example, in a plan view.

Figure 18:
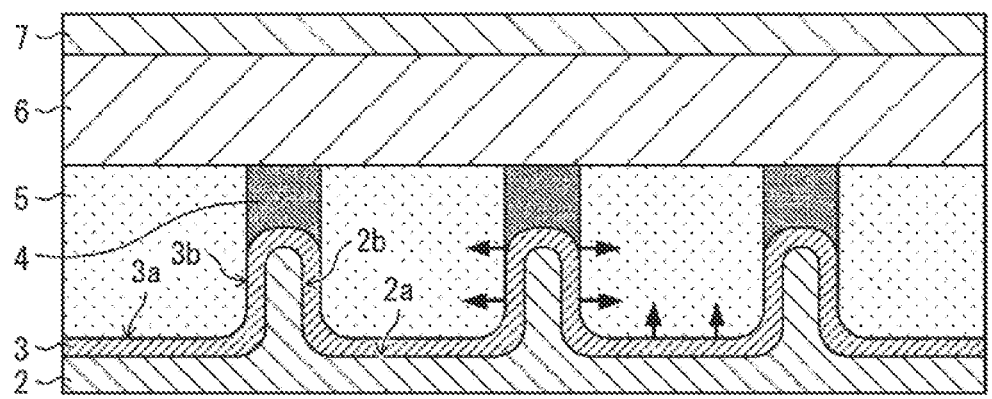
FIG. 18 is a cross-sectional view illustrating an example of a schematic configuration of an anode as well as a recessed portion and a protruding portion of a hole transport layer of the light-emitting element according to a modified example of the first embodiment.
Figure 19:
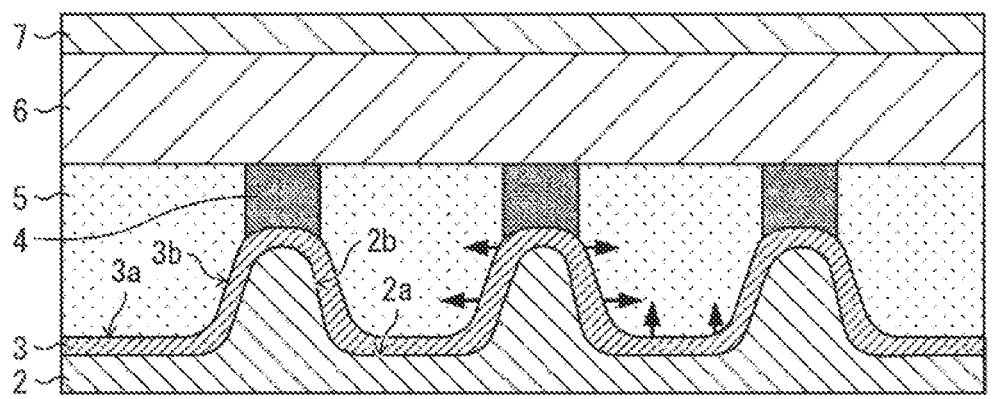
FIG. 19 is a cross-sectional view illustrating another example of a schematic configuration of the anode as well as the recessed portion and the protruding portion of a hole transport layer of the light-emitting element according to a modified example of the first embodiment.

Further, FIG. 18 and FIG. 19 are each a cross-sectional view illustrating an example of a schematic configuration of the recessed portions 2*a*, 3*a* and the protruding portions 2*b*, 3*b* of the light-emitting element 10 according to a modified example of the present embodiment. As described above, the HTL 3 is formed along the anode 2, and the protruding portion 3*b* has a shape geometrically similar to that of the protruding portion 2*b*. Further, the recessed portion 3*a* has a shape geometrically similar to that of the recessed portion 2*a*.

The protruding portions 2*b*, 3*b* desirably have a curved cross-sectional shape as illustrated in FIG. 18 and FIG. 19. In other words, the protruding portions 2*b*, 3*b* desirably include, in a cross-sectional view, curved corner portions without corners where the straight lines meet. In the light-emitting element 10 illustrated in FIG. 18 and FIG. 19, the anode 2 includes a curved surface from the sidewall to the top wall of the protruding portion 2*b*, and includes a curved surface from the bottom wall of the recessed portion 2*a* to the sidewall of the protruding portion 2*b*. Therefore, the HTL 3 on the anode 2 also includes a curved surface from the sidewall to the top wall of the protruding portion 3*b*, and includes a curved surface from the bottom wall of the recessed portion 3*a* to the sidewall of the protruding portion 3*b*. As a result, local electric field concentrations at the corner portions of the protruding portions 2*b*, 3*b* can be avoided.

Note that the method for forming the anode 2 in a wavy shape is not particularly limited, and various known methods in the related art for forming a metal surface in a wavy shape, such as imprinting, for example, can be adopted.

As illustrated in FIG. 18, the protruding portions 2*b*, 3*b* may have a shape in which, in a cross-sectional view, the sidewalls of the protruding portions 2*b*, 3*b* are provided upright, for example, and only the corner portions of the protruding portions 2*b*, 3*b* have a curved shape, thereby imparting the IL4 with the same shape as that of the protruding portion 3*b* in a plan view. Further, as illustrated in FIG. 19, the unevenness composed of the recessed portion 2*a* and the protruding portion 2*b*, and the unevenness composed of the recessed portion 3a and the protruding portion 3b may have, in a cross-sectional view, a wavy shape in which the sidewalls of the protruding portions 2b, 3b are inclined. In the example illustrated in FIG. 19, the IL 4 has the same shape as that of the top wall of the protruding portion 3b, rather than the entire protruding portion 3b, in a plan view. In this way, the IL 4 may have the same shape as that of at least the top wall of the protruding portion 3b in a plan view.

In any case, the IL 4 is desirably provided covering the corner portions of the protruding portion 3b (in other words, covering at least the top wall of the protruding portion 3b in a plan view. As a result, local electric field concentrations at the corner portions of the protruding portions 3b can be avoided.

Figure 20:
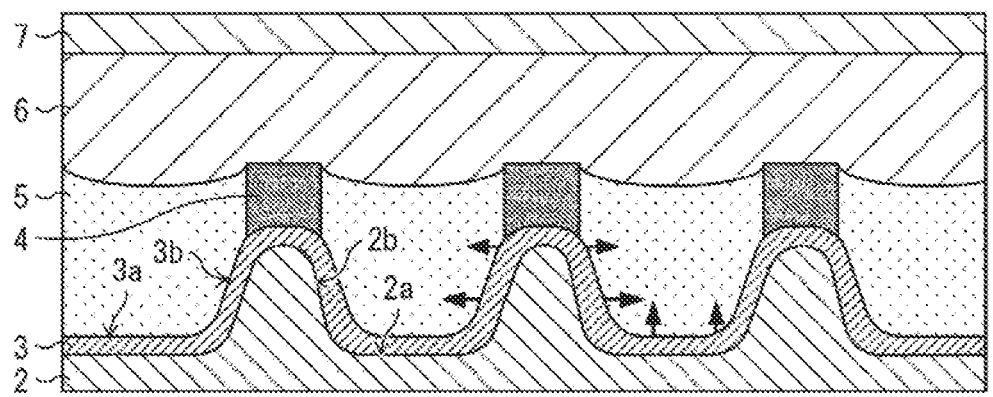
FIG. 20 is a cross-sectional view illustrating an example of a schematic configuration of an EML 5 and an ETL 6 of the light-emitting element according to a modified example of the first embodiment.

Further, FIG. 20 is a cross-sectional view illustrating an example of a schematic configuration of the EML 5 and the ETL 6 of the light-emitting element 10 according to a modified example of the present embodiment.

FIG. 1 illustrates a case in which a surface of the ETL 6 facing the protruding portions 2b, 3b is flat as an example. Nevertheless, the surface of the ETL 6 facing the protruding portions 2b, 3b may have an uneven shape. In this case, in consideration of the flatness of the outermost surface of the EML 5 and the electric field distribution in the layer thickness direction of the EML 5, the surface of the EML 5 between the ILs 4 adjacent to each other may have a downwardly convex shape, as illustrated in FIG. 20. Accordingly, the contact surface of the ETL 6 with the EML 5 may also have a downwardly convex shape in accordance with the shape of the surface of the EML 5. That is, the lower face of the ETL 6 may be alternately provided with a flat portion and a downwardly convex portion along an upper face of the IL 4 and an upper surface of the EML 5. Note that the shape described above can be easily formed by, for example, reducing the viscosity of the colloidal solution used in the EML 5.

Figure 21:
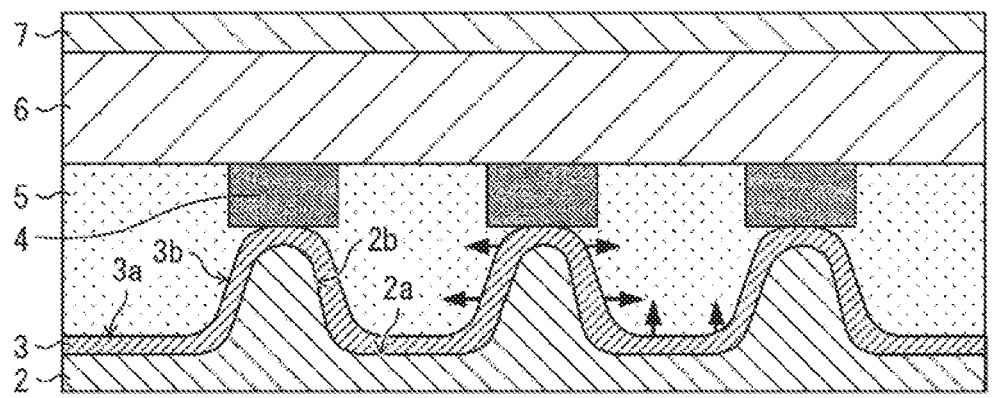
FIG. 21 is a cross-sectional view illustrating an example of a schematic configuration of the insulator layer of the light-emitting element according to a modified example of the first embodiment.

FIG. 21 is a cross-sectional view illustrating an example of a schematic configuration of the IL 4 of the light-emitting element 10 according to a modified example of the present embodiment.

FIG. 1 and FIG. 14 to FIG. 20 each illustrate a case in which the IL 4 has the same shape as that of the top wall of the protruding portion 3b in a plan view as an example. Nevertheless, as illustrated in FIG. 21, the IL 4 may have an overhang shape in which an outer peripheral end of the IL 4 is larger than an outer peripheral end of the protruding portion 3b and a portion of the IL 4 juts out from the top wall of the protruding portion 3b.

In a case in which the IL 4 is to be imparted with the overhang shape described above, examples of the method used therefor include, after formation of the IL 4 in step S9, performing isotropic wet etching using the IL 4 as a mask to etch the HTL 3. Examples of the etching solution in this case include an etching solution having a weight ratio of $HNO_3$:$HCl$:$HF$:$H_2O$=2.5:1.5:1.0:95.9. However, because the HTL 3 is isotropically etched, the bottom wall of the recessed portion 3a needs to be thickened in advance.

Further, FIG. 1 and FIG. 3 each illustrate a case in which the HTL 3 and the IL 4 as well as the EML 5 and the ETL 6 are layered in this order in contact with each other from the anode 2 side, between the anode 2 and the cathode 7, as an example. Nevertheless, a hole injection layer may be further provided between the anode 2 and the HTL 3, for example. Further, an electron injection layer may be further provided between the cathode 7 and the ETL 6.

Further, in the present embodiment, a case in which the light-emitting element 10 is used in the display device 100 is described as an example. Nevertheless, the light-emitting element 10 can be suitably used as a light-emitting element in a light-emitting device other than the display device 100, such as an illumination device.

Second Embodiment

In the present embodiment, differences from the first embodiment will be described. Note that, for convenience of explanation, constituent elements having the same functions as the constituent elements described in the first embodiment will be given the same reference signs, and the description thereof will be omitted.

Figure 22:
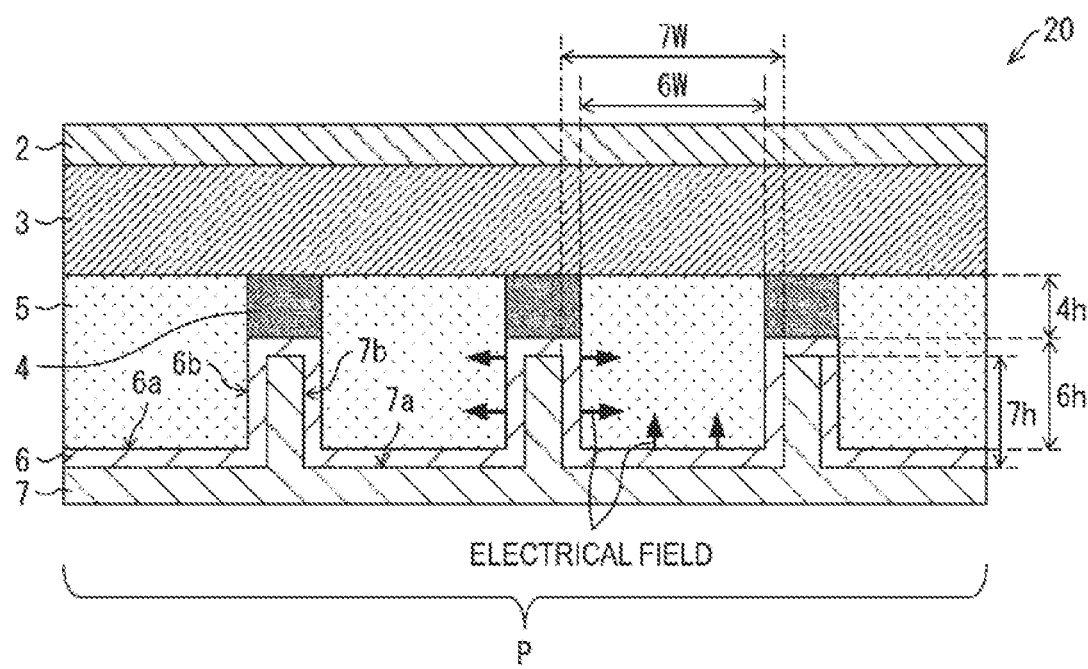
FIG. 22 is a cross-sectional view illustrating an example of a schematic configuration of a light-emitting element according to a second embodiment.

FIG. 22 is a cross-sectional view illustrating an example of a schematic configuration of a light-emitting element 20 according to the present embodiment.

As described above, the first embodiment illustrates a case in which the first electrode is the anode 2, the second electrode is the cathode 7, the first carrier transport layer is the HTL 3, and the second carrier transport layer is the ETL 6 as an example. Nevertheless, the disclosure is not limited thereto, and the first electrode may be the cathode 7, the second electrode may be the anode 2, the first carrier transport layer may be the ETL 6, and second carrier transport layer may be the HTL 3.

The light-emitting element 20 illustrated in FIG. 22 is provided with the cathode 7, the ETL 6, the IL 4 and the EML 5, the HTL 3, and the anode 2 in this order from the lower layer side. More specifically, the light-emitting element 20 may have a configuration in which the cathode 7, the ETL 6, the IL 4 and the EML 5, the HTL 3, and the anode 2 are provided on the substrate 1 illustrated in FIG. 3 in this order from the substrate 1 side. The display device 100 illustrated in FIG. 3 may include the light-emitting element 20 instead of the light-emitting element 10.

In this case, although not illustrated, in the light-emitting element layer 11, for example, the cathode 7, the ETL 6, and the EML 5 are each separated into an island shape for each pixel P by the bank BK. The anode 2 and the HTL 3 are not separated into an island shape by the bank BK, and are formed in common with each pixel P.

However, as described above, in the display device 100, the first electrode, which is the lower electrode, and the first carrier transport layer need only be formed in an island shape for each pixel P, and the second electrode, which is the upper electrode, need only be formed in common with each pixel P. Accordingly, the HTL 3, which is the second carrier transport layer, may be separated into an island shape for each pixel P by the bank BK.

The HTL 3, regardless of whether having an island shape or being a common layer as described above, may be formed of a material common to the light-emitting elements 10R, 10G, 10B or may be formed of a different material for each light-emitting element 10R, 10G, 10B. Similarly, the ETL 6 may also be formed of a material common to the light-emitting elements 10R, 10G, 10B or may be formed of a different material for each light-emitting element 10R, 10G, 10B.

In the present embodiment, the bank BK covers a peripheral edge portion of the cathode 7 instead of the anode 2. As described above, an opening is provided for each pixel P in the bank BK. In the present embodiment, an exposed portion of the cathode 7 by the opening portion of the bank BK is the light-emitting region of each pixel P. The bank BK functions as an edge cover covering the peripheral edge portion of the cathode 7, and functions as a separation wall that separates each pixel P (in other words, separates the light-emitting elements 20).

The sealing layer 8 covers the light-emitting element 20 instead of the light-emitting element 10. Accordingly, in the present embodiment, the sealing layer 8 is formed covering the anode 2.

In the present embodiment, the cathode 7 is electrically connected to the TFTs (specifically, for example, the drain electrode of the TFTs) of the substrate 1.

As illustrated in FIG. 22, the surface of the cathode 7 has unevenness composed of a recessed portion 7a and a protruding portion 7b (second protruding portion) in a cross-sectional view. The cathode 7 includes, in a cross section of one pixel P, at least one protruding portion 7b protruding in the layering direction of each layer described above of the light-emitting element 20. In other words, the cathode 7 of each light-emitting element 20 includes at least one protruding portion 7b.

FIG. 22 illustrates a case in which the cathode 7 of the light-emitting element 20 is provided with a plurality of the protruding portions 7b as an example, this case, it is desirable that the recessed portions 7a and the protruding portions 7b be provided regularly.

In the present embodiment, the ETL 6 is layered on the cathode 7 along the surface of the cathode 7. Therefore, in a cross-sectional view, the ETL 6 has unevenness composed of a recessed portion 6a and a protruding portion 6b (first protruding portion) following the shape of the surface of the cathode 7. That is, the protruding portion 6b covers a surface of the protruding portion 7b. Further, the recessed portion 6a covers a surface of the recessed portion 7a.

Accordingly, the ETL 6 includes, in a cross section of one pixel P, at least one protruding portion 6b protruding in the layering direction of each layer described above of the light-emitting element 20. In other words, the ETL 6 of each light-emitting element 20 used in the display device 100 includes at least one protruding portion 6b. Note that FIG. 22 illustrates a case in which the ETL 6 of one light-emitting element 20 is provided with a plurality of the protruding portions 6b as an example.

The IL 4 is provided in an island shape in contact with the protruding portion 6b and the HTL 3, between the protruding portion 6b and the HTL 3. The IL 4 is not provided on the recessed portion 6a.

Note that, in the present embodiment as well, the IL 4 may be formed on the protruding portion of the first carrier transport layer in the same shape as that of the protruding portion of the first carrier transport layer in a plan view. Accordingly, the IL 4 may be formed on the protruding portion 6b in the same shape as that of the protruding portion 6b in a plan view. The IL 4 may have the same shape as that in FIG. 2 or FIG. 14 to FIG. 17. Accordingly, the protruding portion 6b may be formed in the same shape as the IL4 in FIG. 14 to FIG. 17 in a plan view. Further, the protruding portion 6b may have the same shape as that of the protruding portion 3b illustrated in FIG. 18 or FIG. 19. However, the present embodiment is not limited to the above configuration. The IL 4 may have an overhang shape in which the outer peripheral end of the IL 4 is larger than an outer peripheral end of the protruding portion 6b and a portion of the IL 4 juts out from a top wall of the protruding portion 6b.

In the present embodiment, as illustrated in FIG. 22, the EML 5 is provided in the recessed portion 6a surrounded by the protruding portion 6b, the IL 4 and the bank BK (not illustrated), and thus the height of the outermost surface of the EML 5 matches the height of the outermost surface of the IL 4.

In the present embodiment, the HTL 3 is flat, and the HTL 3 is formed in a continuous film shape on the IL 4 and the EML 5, in contact with the IL 4 and the EML 5. However, the present embodiment is not limited thereto and, needless to say, the HTL 3 may have the same shape as that of the ETL 6 illustrated in FIG. 20.

Further, in the present embodiment, the anode 2 is flat, and the anode 2 is formed in a continuous film shape on the HTL 3.

In the present embodiment, because the first electrode is the cathode 7 and the second electrode is the anode 2 as described above, the layer thickness of the cathode 7 is set in the same way as the layer thickness of the anode 2 in the first embodiment. That is, the portion of the cathode 7 having the thickest layer thickness is suitably set within a range from one times to three times the layer thickness of EML 5. The portion of the cathode 7 having the thickest layer thickness is a portion where the protruding portion 7b is formed. Hereinafter, for convenience of explanation, the portion of the cathode 7 having the thickest layer thickness is referred to as the "protruding portion formation portion of the cathode 7".

On the other hand, the layer thickness of the anode 2 is not particularly limited, and can be set in the same way as the layer thickness of the anode in a light-emitting element in the related art that uses an anode as the upper electrode.

Note that the layer thickness of the cathode 7 indicates the thickness of the cathode 7 in the normal direction of the surface of the cathode 7. Specifically, the layer thickness of the cathode 7 indicates a distance between an upper face and a lower face of the cathode 7. Accordingly, the layer thickness of the cathode 7 in the recessed portion 7a indicates a thickness of a bottom wall of the recessed portion 7a. Further, the layer thickness of the cathode 7 of the protruding portion 7b (that is, the layer thickness of the protruding portion formation portion of the cathode 7) indicates the sum of the height of the protruding portion 7b and the thickness of the bottom wall of the recessed portion 7a.

The portion of the cathode 7 having the thinnest layer thickness is the bottom wall of the recessed portion 7a. The layer thickness of the bottom wall of the recessed portion 7a can be set in the same way as the layer thickness of the cathode in a light-emitting element in the related art that uses a cathode as the lower electrode.

In the present embodiment as well, the EML 5 is formed so that the height of the outermost surface of the EML 5 matches the height of the outermost surface of the IL 4 as described above. Therefore, as illustrated in FIG. 22, the layer thickness of the EML 5 is equal to the sum of the layer thickness 4h of the IL 4 and a height 6h of the protruding portion 6b. Further, the height 6h of the protruding portion 6b is equal to the depth of the recessed portion 6a.

The height 6h can be set in the same way as the height 3h illustrated in FIG. 1. The layer thickness 4h is as described in the first embodiment. The sum of the layer thickness 4h and the height 6h can be set in the same way as the sum of the layer thickness 4h and the height 3h. Accordingly, the sum of the layer thickness 4h and the height 6h is desirably from 30 nm to 100 nm, and more desirably from 40 nm to 100 nm for the same reason as that for the sum of layer thickness 4h and the height 3h. Further, the height 6h is desirably from 20 nm to 90 nm, and more desirably from 20 nm to 80 nm for the same reason as that for the height 3h.

A distance 6W between the protruding portions 6b adjacent to each other (in other words, the width of the recessed portion 6a) can be set in the same way as the distance 3W (in other words, the width of the recessed portion 3a) illustrated in FIG. 1. The distance 6W is desirably not less than 20 nm and not greater than one-half of the cross-sectional width of the light-emitting element 20 in the arrangement direction of the plurality of protruding portions 6b for the same reason as that for the distance 3W. In a case in which QDs are used for the light-emitting material of the EML 5, for example, the distance 6W is desirably two times the particle size of the QDs or greater for the same reason as distance 3W. Further, for the same reason, the depth (that is, the height 6h) of the recessed portion 6a is desirably the particle size of the QDs or greater.

Further, in the present embodiment, similarly to the ITL 3 in the light-emitting element 10 according to the first embodiment, the ETL 6 is suitably formed with a constant layer thickness. Therefore, the layer thickness of the ETL 6 of the protruding portion 6b and the layer thickness of the ETL 6 of the recessed portion 6a are the same. The protruding portion 6b has a shape geometrically similar to that of the protruding portion 7b. Further, the recessed portion 6a has a shape geometrically similar to that of the recessed portion 7a.

Accordingly, the height 6h of the protruding portion 6b is equal to a height 7h of the protruding portion 7b. Note that the height 7h of the protruding portion 7b is equal to the depth of the recessed portion 7a.

Further, a distance 7W between the protruding portions 7b adjacent to each other (in other words, the width of the recessed portion 7a) is a value obtained by subtracting the layer thickness of the ETL 6 from the distance 6W. Accordingly, the distance 7W is set so that the distance 6W is within the range described above. In other words, the distance 7W can be set in the same way as the distance 2W illustrated in FIG. 1.

Note that, in the present embodiment, the layer thickness of the ETL 6 indicates the thickness of the ETL 6 in the normal direction of the surface of the ETL 6. Specifically, the layer thickness of the ETL 6 indicates the distance between the surface of the ETL 6 on the cathode 7 side and the surface of the ETL 6 on the EML 5 side. Further, the layer thickness of the ETL 6 of the protruding portion 6b indicates the layer thickness of a portion of the ETL 6 covering the surface of the protruding portion 7b of the cathode 7. More specifically, the layer thickness of the ETL 6 of the protruding portion 6b indicates the thickness of a sidewall and the thickness of a top wall of the protruding portion 6b. Further, the layer thickness of the ETL 6 of the recessed portion 6b indicates the layer thickness of a portion of the ETL 6 covering the surface other than the protruding portion 7b of the cathode 7. More specifically, the layer thickness of the ETL 6 of the recessed portion 6a indicates the thickness of a bottom wall of the recessed portion 6a.

Note that the ETL 6 need only be set so that the height 6h and the distance 6W are within the ranges described above. The layer thickness itself of the ETL 6 is not particularly limited as long as it is a thickness at which the electron transport function is sufficiently exhibited. The layer thickness of the ETL 6 can be set in the same way as the layer thickness of an ETL in a known self-light-emitting element for a display panel in the related art.

Similarly, the layer thickness of the HTL 3 is not particularly limited as long as it is a thickness at which the hole transport function is sufficiently exhibited. The layer thickness of the HTL 3 can be set in the same way as the layer thickness of an HTL in a known self-light-emitting element for a display panel in the related art.

The light-emitting element 20 and the display device 100 including the light-emitting element 20 can be manufactured by the same manufacturing methods as those of the light-emitting element 10 and the display device 100 including the light-emitting element 10 according to the first embodiment by changing the order of the layers layered as described above.

According to the present embodiment, as illustrated in FIG. 22, the ETL 6 includes the protruding portions 6b, thereby increasing the contact area between the ETL 6 and the EML 5 and expanding an area in which the electrons are transported by the ETL 6. Further, as illustrated in FIG. 22, the electric field from the surface of the ETL 6 toward the EML 5 is distributed along the shape of the ETL 6. Specifically, the electric field from the surface of the ETL 6 toward the EML 5 is distributed in the normal direction of the surfaces of the recessed portion 6a and the protruding portion 6b of the ETL 6. Therefore, the light-emitting element 20 has a large electric field distribution compared to that of a light-emitting element in the related art in which the protruding portion 3b is not provided on the surface of the ETL 6. Therefore, according to the present embodiment, holes can be injected not only in the direction parallel to the layer thickness direction of the EML 5, but at a wide angle in the surface of the EML 5. Therefore, according to the present embodiment, the electron injection efficiency is improved over that in the related art.

Further, in the light-emitting element 20, light is scattered by the cathode 7 and the sidewalls of the protruding portions 7b, 6b of the ETL 6. Therefore, according to the light-emitting element 20, the scattered light is increased as compared to that of a light-emitting element in the related art in which the protruding portion 3b is not provided on the surface of the ETL 6, and the scattered light is multi-reflected. Therefore, according to the present embodiment as well, similarly to the first embodiment, the light extraction efficiency is improved over that in the related art.

Furthermore, in the present embodiment as well, the IL 4 can insulate the ETL 6 and HTL 3 and prevent an electric field concentration between the ETL 6 and the HTL 3. As a result, it is possible to prevent the generation of a large local electric field and thus prevent the breakdown of the EML 5.

Further, at this time, the IL 4 is provided in contact with the protruding portion 6b and the HTL 3 as illustrated in FIG. 22, making it possible to more reliably prevent an electric field concentration between the ETL 6 and the HTL 3, and more reliably prevent the generation of a large local electric field. This makes it possible to more reliably prevent the breakdown of the EML 5. Further, the electric field distribution on the protruding portion 6b can be more reliably eliminated, making it possible to uniformly inject the electrons as carriers from the ETL 6 into the EML 5.

Furthermore, in the present embodiment, as described above, the layer thickness of the ETL 6 is constant regardless of location, and the ETL 6 has the same layer thickness at the recessed portion 6a and the protruding portion 6b. Therefore, in the light-emitting element 20, the field intensity of the electric field applied between the ETL 6 and the EML 5 does not fluctuate within the ETL 6 and cause an in-plane distribution, but rather is substantially constant throughout the cross section of the light-emitting element 20.

Therefore, according to the present embodiment, when an external electric field is applied to the light-emitting element 20 to inject electrons from the ETL 6 into the EML 5, electrons can be uniformly injected across the entire in-plane region of the EML 5. Further, there is no region where the transport efficiency of the electrons injected from the ETL 6 into the EML 5 is reduced, making it possible to maintain a constant carrier balance between the electrons and the holes. Moreover, because there is no distribution in field intensity, element breakdown of the light-emitting element 20 due to an electric field concentration can be prevented.

Further, similarly to the first embodiment, depending on the viscosity or the surface tension of the colloidal solution used in the EML 5, for example, the outermost surface of the EML 5 may not reach the same height as that of the outermost surface of the IL 4. In this case, according to the present embodiment, the electric field at or near the outermost surface of the ETL 6 is only slightly reduced in the region where the outermost surface of the EML 5 rises, making it possible to uniformly inject electrons across the entire in-plane region of the EML 5.

Third Embodiment

In the present embodiment, differences from the first and second embodiments will be described. For convenience of explanation, note that constituent elements having the same functions as the constituent elements described in the first and second embodiments will be given the same reference signs, and the description thereof will be omitted.

Figure 23:
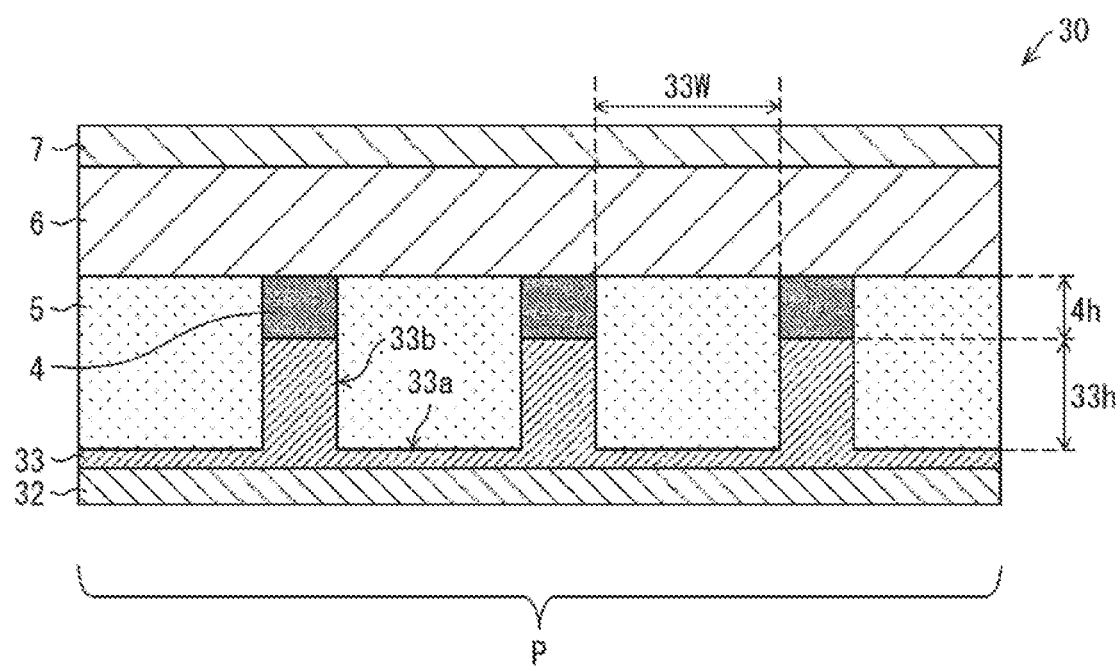
FIG. 23 is a cross-sectional view illustrating an example of a schematic configuration of a light-emitting element according to a third embodiment.

FIG. 23 is a cross-sectional view illustrating an example of a schematic configuration of a light-emitting element 30 according to the present embodiment. Note that, in FIG. 24, the horizontal axis indicated as "Position of surface of anode" is the same as the horizontal axis indicated as "Position of surface of anode" in FIG. 11 and, in the present embodiment, indicates the position when the anode 2 illustrated in FIG. 23 is crossed horizontally.

As illustrated in FIG. 23, the light-emitting element 30 according to the present embodiment has a configuration in which an anode 32, an HTL 33, the IL 4 and the EML 5, the ETL 6, and the cathode 7 are provided in this order from the lower layer side.

Note that the present embodiment, as illustrated in FIG. 23, describes a case in which the first electrode is the anode 32, the second electrode is the cathode 7, the first carrier transport layer is the HTL 33, and the second carrier transport layer is the ETL 6 as an example. Nevertheless, the present embodiment is not limited thereto, and the first electrode may be the cathode, the second electrode may be the anode, the first carrier transport layer may be the ETL, and second carrier transport layer may be the HTL.

The light-emitting element 30 according to the present embodiment has the same configuration as that of the light-emitting element 10 according to the first embodiment except that the anode 32 and the HTL 33 are provided instead of the anode 2 and the HTL 3, a surface of the anode 32 is flat, and unevenness is provided only to a surface of the HTL 33. The anode 32 has the same configuration as that of the anode 2 according to the first embodiment except that the surface is flat as described above. Further, the HTL 33 has the same configuration as that of the HTL 3 according to the first embodiment except for the points described below.

In the light-emitting element 30, the surface of the HTL 33 has unevenness composed of a recessed portion 33a and a protruding portion 33b (first protruding portion) in a cross-sectional view. Nevertheless, the anode 32 is not provided with a recessed portion and a protruding portion on the surface, and has a constant layer thickness. Therefore, the HTL 33 has a different layer thickness in the recessed portion 33a and the protruding portion 33b.

However, in the present embodiment as well, the EML 5 is formed so that the height of the outermost surface of the EML 5 matches the height of the outermost surface of the IL 4. Therefore, as illustrated in FIG. 23, the layer thickness of the EML 5 is equal to the sum of the layer thickness 4h of the IL 4 and a height 33h of the protruding portion 33b. Further, the height 33h of the protruding portion 33b is equal to the depth of the recessed portion 33a.

The height 33h can be set in the same way as the height 3h illustrated in FIG. 1. Further, the layer thickness 4h is as described in the first embodiment. The sum of the layer thickness 4h and the height 33h can be set in the same way as the sum of the layer thickness 4h and the height 3h. Accordingly, the sum of the layer thickness 4h and the height 33h is desirably from 30 nm to 100 nm, and more desirably from 40 nm to 100 nm for the same reason as that for the sum of layer thickness 4h and the height 3h. Further, the height 33h is desirably from 20 nm to 90 nm, and more desirably from 20 nm to 80 nm for the same reason as that for the height 3h.

Further, a distance 33W between the protruding portions 33b adjacent to each other (in other words, the width of the recessed portion 33a) can be set in the same way as the distance 3W (in other words, the width of the recessed portion 3a) illustrated in FIG. 1. The distance 33W is desirably not less than 20 nm and not greater than one-half of the cross-sectional width of the light-emitting element 30 in the arrangement direction of the plurality of protruding portions 33b for the same reason as that for the distance 3W. In a case in which QDs are used for the light-emitting material of the EML 5, for example, the distance 33W is desirably two times the particle size of the QDs or greater for the same reason as distance 3W. Further, for the same reason, the depth (in other words, the height 33h) of the recessed portion 33a is desirably the particle size of the QDs or greater.

Note that, in the present embodiment, the layer thickness of the HTL 33 indicates the thickness in the normal direction of the surface of the HTL 33. Specifically, the layer thickness of the HTL 33 indicates the distance between the surface of the HTL 33 on the anode 32 side and the surface of the HTL 33 on the EML 5 side. Further, the layer thickness of the HTL 33 of the recessed portion 33a indicates the thickness of a bottom wall of the recessed portion 33a. The layer thickness of the HTL 33 of the protruding portion 33b indicates the sum of the height of the protruding portion 33b and the thickness of the bottom wall of the recessed portion 33a.

The portion of the HTL 33 having the thinnest layer thickness is the bottom wall of the recessed portion 33a. The layer thickness of the bottom wall of the recessed portion 33a is not particularly limited as long as it is a thickness at which the hole transport function is sufficiently exhibited. The thickness of the bottom wall of the recessed portion 33a can be set in the same way as the layer thickness of an HTL in a known self-light-emitting element for a display panel in the related art.

Further, the layer thickness of the anode 32 is also not particularly limited, and can be set in the same way as the layer thickness of an anode in a light-emitting element in the related art that uses an anode as the lower electrode. Note that the layer thickness of the anode 32 indicates the thickness of the anode 32 in the normal direction of the surface of the anode 32.

The light-emitting element 30 and the display device 100 including the light-emitting element 30 can be manufactured by the same manufacturing methods as those of the light-emitting element 10 and the display device 100 including the light-emitting element 10 according to the first embodiment except that unevenness is formed only on the surface of the HTL 33.

That is, in the present embodiment, in step S1 illustrated in the first embodiment, after formation of the anode 32 having a flat surface in the same way as before, the bank BK is formed without performing step S2 and step S3, and the process proceeds to step S4. Note that, in step S4, the hole transport material layer 13 having a thickness greater than or equal to the height 31h of the protruding portion 3b described above is formed. In this case, the layer thickness of the hole transport material layer 13 is suitably set within a range from one times to three times the layer thickness of the EML 5.

Subsequently, in step S5, the same mask 112 as in the first embodiment is formed and, similarly to the first embodiment in step S6, regions of the surface of the hole transport material layer 13 not covered by the mask 112 are etched, in a plan view. Thus, in a plan view, the protruding portions 33b are formed in the regions of the surface of the hole transport material layer 13 covered by the mask 112 and not etched, and the recessed portions 33a are formed in the other regions. As a result, the HTL 33 having unevenness composed of the recessed portion 33a and the protruding portion 33b is formed. Note that the post process is the same as that in the first embodiment.

Figure 24:
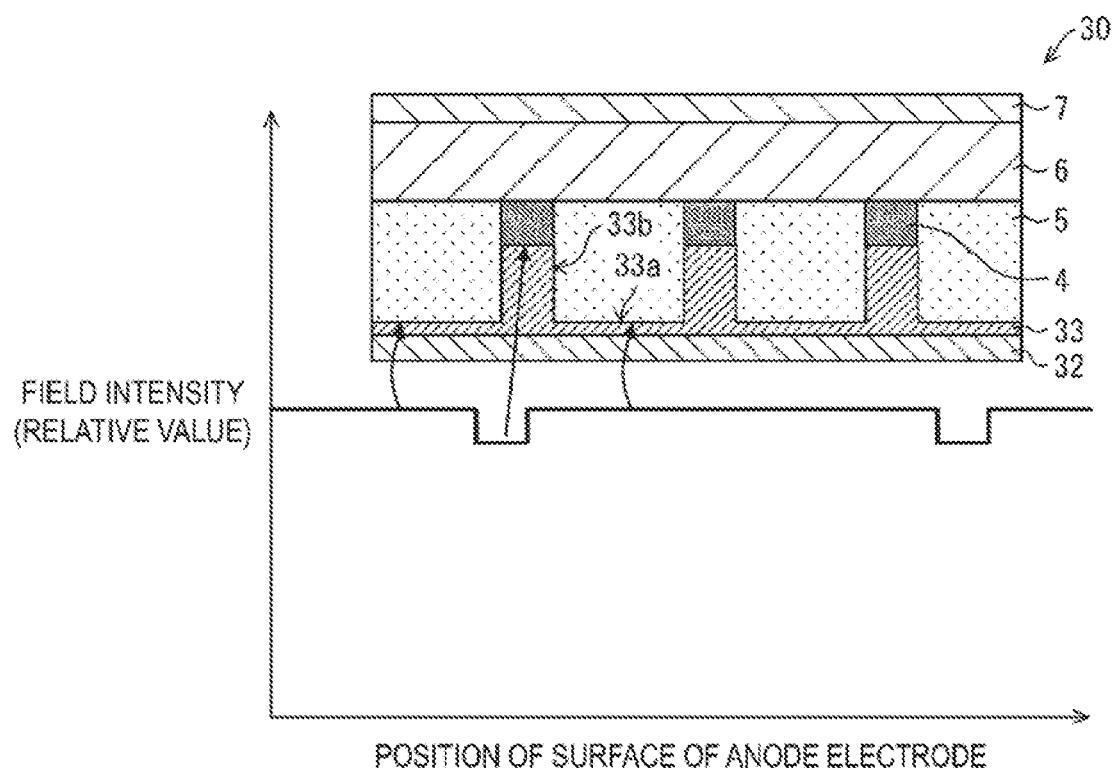
FIG. 24 is a drawing illustrating a field intensity along a surface of a hole transport layer of the light-emitting element illustrated in FIG. 23.

FIG. 24 is a drawing illustrating a field intensity along a surface of the HTL 33 of the light-emitting element 30 illustrated in FIG. 23.

In the present embodiment, as described above, the layer thickness of the HTL 33 is different in the recessed portion 33a and the protruding portion 33b. The resistivity of the HTL 33 is higher than the resistivity of the anode 32. Therefore, in the light-emitting element 30, regions where the layer thickness of the HTL 33 is thin and regions where the layer thickness of the HTL 33 is thin give rise to differences in intensity in the electric field at or near the surface of the HTL 33. Specifically, as illustrated in FIG. 24, in the protruding portion 33b having a thick layer thickness of the HTL 33, the field intensity is lower than that in the recessed portion 33a having a thin layer thickness of the HTL 33.

In this way, in the present embodiment, unlike the light-emitting element 10, the field intensity at or near the surface of the HTL 33 slightly changes. Therefore, depending on the distribution of the field intensity, the carrier injection efficiency changes depending on the location in the surface of the light-emitting element 30.

Nevertheless, in the present embodiment as well, similarly to the first embodiment, the HTL 33 includes the protruding portion 33b as illustrated in FIG. 23, increasing the contact area between the HTL 33 and the EML 5. Further, in the present embodiment as well, similarly to the first embodiment, as illustrated in FIG. 23, the electric field from the surface of the HTL 33 toward the EML 5 is distributed along the shape of the HTL 33. Therefore, in comparison to the light-emitting element 500 in the related art in which the protruding portion 3b is not provided on the surface of the HTL 3, improvement in the electric field distribution is observed even in a case in which only the HTL 33 has a protruding shape as in the case of the light-emitting element 30.

Further, as described above, in the configuration of PTL 2, carrier injection occurs substantially in the formation region of the protruding portion only. Nevertheless, according to the present embodiment, the IL 4 directly above the protruding portion 3b can suppress selective carrier injection from the protruding portion 3b. Therefore, the carrier can be more uniformly injected compared to PTL 2.

Further, according to the light-emitting element 30, light is scattered on the sidewalls of the protruding portions 33b of the HTL 33. Therefore, according to the light-emitting element 30, the scattered light is increased compared to that in the light-emitting element 500 in the related art. Therefore, according to the light-emitting element 30, compared to the light-emitting element 500 in the related art, light emitted to the outside at angles that allow avoidance of the total reflection described above (that is, the total reflection at the interface between the sealing layer 8 and the atmosphere described above) is increased. Accordingly, according to the light-emitting element 30, the EQE can be improved over the light-emitting element 500 in the related art.

Fourth Embodiment

In the present embodiment, differences from the first to third embodiments will be described. For convenience of explanation, note that constituent elements having the same functions as the constituent elements described in the first to third embodiments will be given the same reference signs, and the description thereof will be omitted.

Figure 25:
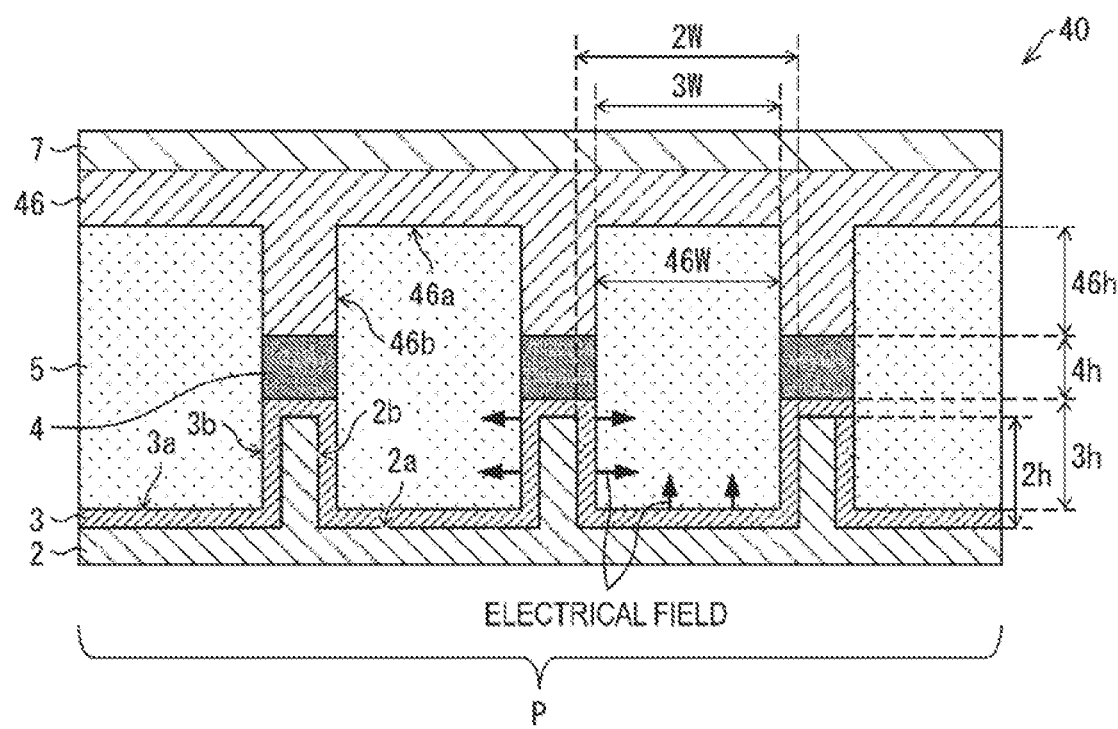
FIG. 25 is a cross-sectional view illustrating an example of a schematic configuration of a light-emitting element according to a fourth embodiment.

FIG. 25 is a cross-sectional view illustrating an example of a schematic configuration of a light-emitting element 40 according to the present embodiment.

As illustrated in FIG. 25, the light-emitting element 40 according to the present embodiment has a configuration in which the anode 2, the HTL 3, the IL 4 and the EML 5, an ETL 46, and the cathode 7 are provided in this order from the lower layer side.

Note that the present embodiment, as illustrated in FIG. 25, describes a case in which the first electrode is the anode 2, the second electrode is the cathode 7, the first carrier transport layer is the HTL 3, and the second carrier transport layer is the ETL 46 as an example. Nevertheless, the present embodiment is not limited thereto, and the first electrode may be the cathode, the second electrode may be the anode, the first carrier transport layer may be the ETL, and second carrier transport layer may be the HTL.

The light-emitting element 40 according to the present embodiment has the same configuration as that of the light-emitting element 10 according to the first embodiment, except that the ETL 46 is provided instead of the ETL 6, and the ETL 46 is provided with a protruding portion 46b (third protruding portion) facing the protruding portion 3b with the IL 4 interposed therebetween. Note that, the ETL 46 has the same configuration as that of the ETL 6 according to the first embodiment except for the points described below.

A surface of the ETL 46 facing the HTL 3 is provided with unevenness composed of a recessed portion 46a and the protruding portion 46b in a cross-sectional view. The protruding portion 46b has a downwardly convex shape. That is, in the present embodiment, both the first carrier transport layer and the second carrier transport layer facing each other are not flat and both include protruding portions.

In the present embodiment, the EML 5 is provided so that, in the space including the recessed portions 3a, 46a surrounded by a layered body of the protruding portion 3b, the IL 4, and the protruding portion 46b as well as the bank BK (not illustrated), the height of the outermost surface of the EML 5 matches a height of a surface of a bottom wall of the recessed portion 46a on the EML 5 side.

Therefore, although an upper face of the bank BK is formed to the same height as that of an upper face of the IL 4 in FIG. 3, in the present embodiment, the upper face of the bank BK is formed to the same height as the surface of the bottom wall of the recessed portion 46a on the EML 5 side.

Therefore, as illustrated in FIG. 25, the layer thickness of the EML 5 is equal to the sum of the layer thickness 4h of the IL 4, the height 3h of the protruding portion 3b, and a height 46h of the protruding portion 46b.

Accordingly, for the same reason as described in the first embodiment, the sum of the layer thickness 4h of the IL 4, the height 31h of the protruding portion 3b, and the height 46h of the protruding portion 46b is desirably 100 nm or less, which is the upper limit of the EML 5. Note that, as illustrated in FIG. 25, the height 46h of the protruding portion 46b is equal to the depth of the recessed portion 46a. The layer thickness 4h is as described in the first embodiment.

Further, although the lower the height 3h, the higher the scattering effect as described in the first embodiment, in terms of the processing process, there is a limit to the height 3h that can be processed. Due to competition between this scattering effect and the processing process, the lower limit of the height 3h at which the highest scattering effect can be obtained on a processable scale is 20 nm. For the same reason, the lower limit of the height 46 h where the highest scattering effect can be obtained on a processable scale is also 20 nm. Accordingly, although it depends on the processing method, the lower limit of the sum of the height 3h and the height 46h is 40 nm.

Therefore, the upper limit of the sum of the height 3h and the height 46h is 90 nm, a value obtained by subtracting 10 nm, which is the lower limit of the layer thickness 4h, from 100 nm, which is the upper limit of the layer thickness of the EML 5. Further, because the layer thickness 4h is desirably 20 nm or greater as described above, the sum of the height 3h and the height 46h is more desirably 80 nm or less.

Accordingly, the sum of the layer thickness 4h of the IL 4, the height 3h of the protruding portion 3b, and the height 46h of the protruding portion 46b is desirably from 50 nm to 100 nm, and more desirably from 60 nm to 100 nm. Therefore, the layer thickness of the EML 5 is desirably from 50 nm to 100 nm, and more desirably from 60 nm to 100 nm.

Further, the height 3h is a value obtained by subtracting the layer thickness 4h and the height 46h from the layer thickness of the EML 5. Therefore, the height 3h is desirably from 20 nm to 70 nm, and more desirably from 20 nm to 60 nm. Similarly, the height 46h is desirably from 20 nm to 70 nm, and more desirably from 20 nm to 60 nm.

However, as described above, the lower the height 3h and the height 46h, the higher the scattering effect. Accordingly, as long as processing is possible, the height 3h and the height 46h may each be 20 nm or less (where 3h>0 nm, 46h>0 nm). However, as described in the first embodiment, the depth (that is, the height 3h) of at least the recessed portion 3a is desirably the particle size of the QDs or greater.

Further, a distance 46W between the protruding portions 46b adjacent to each other (in other words, the width of the recessed portion 46a) can be set in the same way as the distance 3W (in other words, the width of the recessed portion 3a). The distance 46W is desirably not less than 20 nm and not greater than one-half of the cross-sectional width of the light-emitting element 40 in the arrangement direction of the plurality of protruding portions 46b for the same reason as that for the distance 3W. Further, in a case in which QDs are used for the light-emitting material of the EML 5, for example, the distance 46W is desirably two times the particle size of the QDs or greater, for the same reason as that for the distance 3W.

In the present embodiment as well, the height 31i of the protruding portion 3b is equal to the height 2h of the protruding portion 2b, and the height 2h of the protruding portion 2b is equal to the depth of the recessed portion 2a. Further, the distance 2W between the protruding portions 2b adjacent to each other (in other words, the width of the recessed portion 2a) is a value obtained by subtracting the layer thickness of the HTL 3 from the distance 3W.

Note that, in the present embodiment, the layer thickness of the ETL 46 indicates the thickness in the normal direction of the surface of the HTL 3. Specifically, the layer thickness of the ETL 46 indicates a distance between the surface of the ETL 46 on the cathode 7 side and the surface of the ETL 46 on the EML 5 side. Further, the layer thickness of the ETL 46 of the recessed portion 46a indicates a thickness of the bottom wall of the recessed portion 46a. The layer thickness of the ETL 46 of the protruding portion 46b indicates the sum of the height of the protruding portion 46b and the thickness of the bottom wall of the recessed portion 46a.

The portion of the ETL 46 having the thinnest layer thickness is the bottom wall of the recessed portion 46a. The layer thickness of the ETL 46 need only be set so that the height 46h and the distance 46W are within the ranges described above. The layer thickness of the bottom wall of the recessed portion 46a is not particularly limited as long as it is a thickness at which the electron transport function is sufficiently exhibited. The thickness of the bottom wall of the recessed portion 46a can be set in the same way as the layer thickness of an ETL in a known self-light-emitting element for a display panel in the related art.

The light-emitting element 40 and the display device 100 including the light-emitting element 40 can be manufactured by the same manufacturing methods as those of the light-emitting element 10 and the display device 100 including the light-emitting element 10 according to the first embodiment except for the differences described below.

Figure 26:
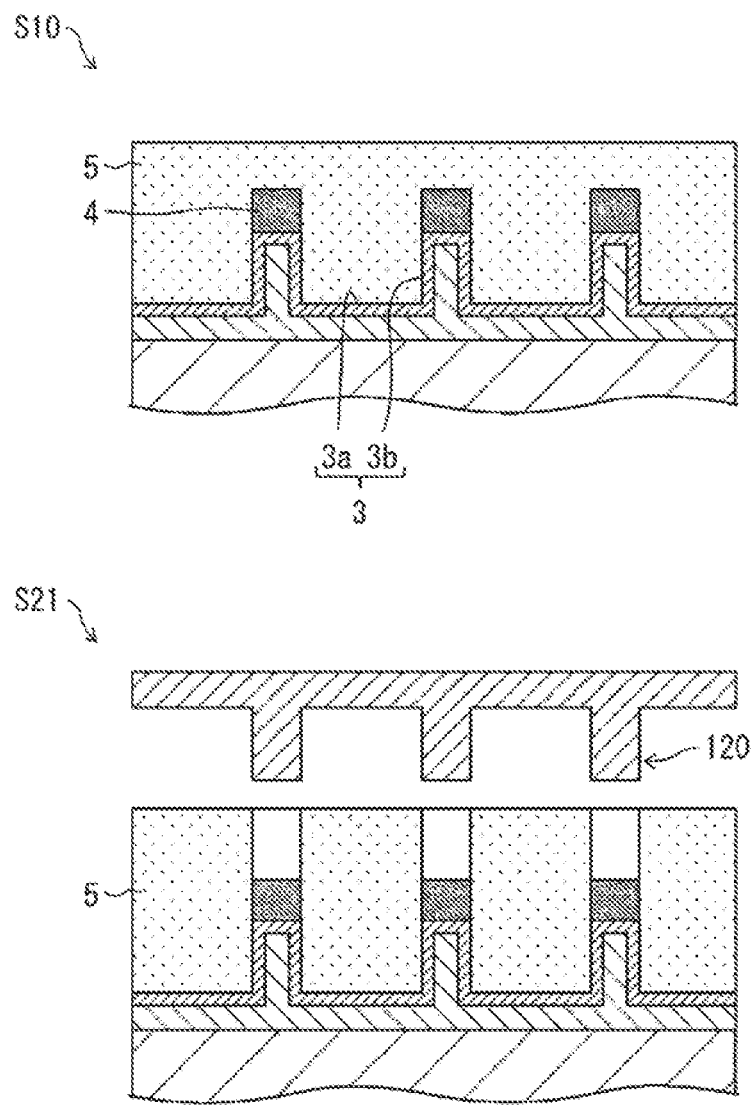
FIG. 26 is a cross-sectional view illustrating, in order, a portion of a process for manufacturing the light-emitting element of the display device according to the fourth embodiment.
Figure 27:
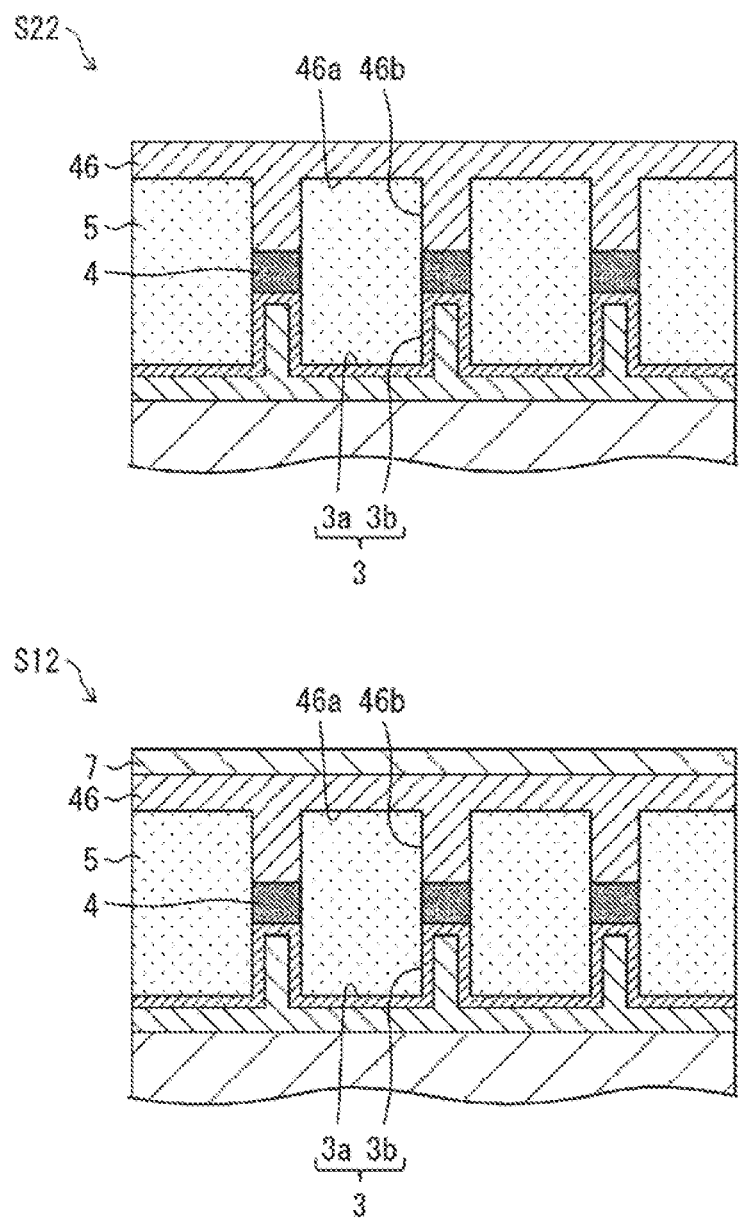
FIG. 27 is another cross-sectional view illustrating, in order, a portion of a process for manufacturing the light-emitting element of the display device according to the fourth embodiment.

FIG. 26 and FIG. 27 are cross-sectional views illustrating, in order, a portion of a process for manufacturing the light-emitting element 40 of the display device 100 according to the present embodiment. FIG. 26 and FIG. 27 each illustrate a cross section of the display device 100 corresponding to the cross section of the light-emitting element 40 illustrated in FIG. 25.

Note that, in the present embodiment, the bank BK is formed so that the upper face thereof has the same height as the surface of the bottom wall of the recessed portion 46a on the EML 5 side as described above. Therefore, in the present embodiment, the bank BK is formed higher than the upper face of the IL 4. Otherwise, in the manufacturing process of the light-emitting element 40 of the display device 100 according to the present embodiment, the processes up to those illustrated in FIG. 26 are the same as those of steps S1 to S9 illustrated in FIG. 4 to FIG. 6.

In the present embodiment, after step S9, the EML 5 is formed in step S10 as in the first embodiment. However, in step S10, in the space including the recessed portion 3a surrounded by a layered body of the protruding portion 3b, the IL4, and the protruding portion 46b as well as the bank BK (not illustrate), the EVIL 5 is formed so that the height of the outermost surface of the EML 5 matches the height of the outermost surface of the bank BK. Therefore, in the present embodiment, as illustrated in S10 in FIG. 26, the EML 5 is formed covering the upper face of the IL 4 in step S10.

Next, as indicated by S21 in FIG. 26, a shape that will serve as the protruding portion 46b is engraved on the surface of the EML 5 by imprinting by a mold 120 having an inverted shape of the recessed portion 46a and the protruding portion 46b. Specifically, a recessed portion having the same shape as the protruding portion 46b is formed on the surface of the EML 5.

Typically, the imprinting is performed at a temperature at or above the softening point of the material to be processed. Nevertheless, in a case in which the EML 5 is, for example, a QD layer, the QD layer is a layered body of nanoparticles and thus the heating of the EML 5 is not required. The EML 5 can be processed without damage by just pressing the mold 120 without heating.

Next, as illustrated in S22 in FIG. 27, the ETL 46 is formed on the IL 4 and the EML 5, forming the protruding portion 46b in the recessed portion described above on the surface of the EML 5 (step S22). At this time, in a case in which the light-emitting element 40 is part of the display device 100, the ETL 46 is formed as a common layer common to each pixel P, for example, as in the case of the ETL 6.

For the film formation method of the ETL 46, various methods known in the related art as ETL film formation methods can be used, such as sputtering, vapor deposition, and colloidal solution application. Step S22 is the same as step S11 in the first embodiment except that the protruding portion 46b is formed in the recessed portion described above on the surface of the EML 5.

Next, as illustrated in S12 in FIG. 27, the cathode 7 is formed on the ETL 46 in the same way as in step S12 in the first embodiment. At this time, in a case in which the light-emitting element 40 is part of the display device 100 as described above, the cathode 7 is formed as a common layer common to each pixel P. The post process is the same as that in the first embodiment.

Note that FIG. 25 illustrates a case in which the cathode 7 is flat as an example. Nevertheless, in step S22 illustrated in S22 of FIG. 27, the recessed portion 7a and the protruding portion 7b, needless to say, may be formed on the contact surface of the cathode 7 with the ETL 46 by forming the ETL 46 to the same layer thickness in the recessed portion 46a and the protruding portion 46b.

According to the present embodiment, in addition to the anode 2 and the HTL 3, unevenness is formed on the surface of the ETL 46 or the surface of the ETL 46 and the cathode 7, and thus the effects described in first embodiment and the second embodiment are exhibited in combination. According to the present embodiment, the electric field distribution in the layer thickness direction of the EML 5 can be made more uniform. Further, according to the present embodiment, it is possible to inject carriers uniformly into the ELM 5 from not only the HTL 3 but also the ETL 46, and thus control the carrier balance between the electrons and the holes more readily. Furthermore, according to the present embodiment, the outermost surface of the EML 5 does not need to be set to the same height as that of the outermost surface of the IL 4 and thus, compared to the first to third embodiments, the flatness of the surface of the EML 5 can be improved.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

REFERENCE SIGNS LIST

1 Substrate
2, 32 Anode electrode
3, 33, 46 HTL (hole transport layer)
4 IL (insulator layer)
5 EML (light-emitting layer)
6, 46 ETL (electron transport layer)
7 Cathode electrode
10, 10R, 10G, 10B, 20, 30, 40 Light-emitting element
2a, 3a, 6a, 7a, 33a, 46a Recessed portion
2b, 3b, 3b1, 3b2, 3b3, 6b, 7b, 33b, 46b Protruding portion
3bA, 4A Trunk line portion
3bB, 4B Branch line portion
100 Display device
P Pixel

The invention claimed is:

1. A light-emitting element comprising:
a first electrode;
a first carrier transport layer;
a light-emitting layer;
a second carrier transport layer; and
a second electrode, wherein
the first electrode, the first carrier transport layer, the light-emitting layer, the second carrier transport layer, and the second electrode are layered in this order,
the first carrier transport layer includes at least one first protruding portion protruding in a layering direction,
an insulator layer overlapping the at least one first protruding portion in a plan view is provided between the at least one first protruding portion and the second carrier transport layer,
the first electrode includes at least one second protruding portion protruding in the layering direction,
the first carrier transport layer is formed along a surface of the first electrode,
the at least one first protruding portion covers a surface of the at least one second protruding portion, and
a direction of light emitted from the light-emitting element corresponds to the layering direction in which the first electrode and the second electrode are layered.

2. The light-emitting element according to claim 1, wherein
a layer thickness of the at least one first protruding portion of the first carrier transport layer and a layer thickness of a portion other than the at least one first protruding portion of the first carrier transport layer are the same.

3. The light-emitting element according to claim 1, wherein the insulator layer is provided in contact with the at least one first protruding portion and the second carrier transport layer.

4. The light-emitting element according to claim 1, wherein the at least one first protruding portion includes a corner portion that curves in the plan view.

5. The light-emitting element according to claim 4, wherein the insulator layer covers the corner portion.

6. The light-emitting element according to claim 1, wherein the at least one first protruding portion has a curved cross-sectional shape.

7. A light-emitting element comprising:
a first electrode;
a first carrier transport layer;
a light-emitting layer;
a second carrier transport layer; and
a second electrode, wherein
the first electrode, the first carrier transport layer, the light-emitting layer, the second carrier transport layer, and the second electrode are layered in this order,
the first carrier transport layer includes at least one first protruding portion protruding in a layering direction,
an insulator layer overlapping the at least one first protruding portion in a plan view is provided between the at least one first protruding portion and the second carrier transport layer, and
a sum of a layer thickness of the insulator layer and a height of the at least one first protruding portion is within a range from 30 nm to 100 nm.

8. The light-emitting element according to claim 1, wherein the second carrier transport layer includes at least one third protruding portion facing the at least one first protruding portion with the insulator layer interposed therebetween.

9. A light-emitting element comprising:
a first electrode;
a first carrier transport layer;
a light-emitting layer;
a second carrier transport layer; and
a second electrode, wherein
the first electrode, the first carrier transport layer, the light-emitting layer, the second carrier transport layer, and the second electrode are layered in this order,
the first carrier transport layer includes at least one first protruding portion protruding in a layering direction,
an insulator layer overlapping the at least one first protruding portion in a plan view is provided between the at least one first protruding portion and the second carrier transport layer, and
the at least one first protruding portion has a fishbone shape, including a trunk line portion and a plurality of branch line portions extending in an in-plane direction from the trunk line portion, in the plan view.

10. The light-emitting element according to claim 9, wherein the at least one first protruding portion comprises a plurality of first protruding portions, and
the plurality of branch line portions provided on one of the plurality of first protruding portions and the plurality of branch line portions provided on another one of the plurality of first protruding portions, adjacent to the one of the plurality of first protruding portions, are alternately arranged in the plan view.

11. The light-emitting element according to claim 1, wherein the at least one first protruding portion comprises a plurality of first protruding portions, and
the plurality of first protruding portions is formed in a stripe shape in the plan view.

12. The light-emitting element according to claim 1, wherein the at least one first protruding portion comprises a plurality of first protruding portions, and
the plurality of first protruding portions is formed in a matrix shape in the plan view.

13. The light-emitting element according to claim 1, wherein the at least one first protruding portion comprises a plurality of first protruding portions, and
the plurality of first protruding portions is formed in a zig-zag shape in the plan view.

14. The light-emitting element according to claim 13, wherein a first set of first protruding portions, in the plurality of first protruding portions, that are adjacent to each other in a first direction, is parallel to a second set of first protruding portions, in the plurality of first protruding portions, that are adjacent to each other in the first direction, such that a gap between each two adjacent first protruding portions in the first set is adjacent, in a second direction, to a first protruding portion in the second set, wherein the second direction is perpendicular to the first direction.

15. The light-emitting element according to claim 10, wherein a distance between first protruding portions, in the plurality of first protruding portions, adjacent to each other is not less than 20 nm and not greater than one-half of a cross-sectional width of the light-emitting element in an arrangement direction of the first protruding portions, in the plurality of first protruding portions, adjacent to each other.

16. A display device comprising:
a plurality of pixels,
wherein each of the plurality of pixels includes the light-emitting element according to claim 1,
the first electrode and the light-emitting layer are formed in an island shape for each of the plurality of pixels, and
the second electrode is formed in common with the plurality of pixels.

17. The light-emitting element according to claim 1, wherein a layer thickness of the insulator layer is 10 nm or greater.

18. The light-emitting element according to claim 17, wherein the layer thickness of the insulator layer is 20 nm or greater.

* * * * *